United States Patent [19]
Nomura et al.

[11] Patent Number: 5,781,817
[45] Date of Patent: Jul. 14, 1998

[54] EXPOSURE CONTROLLING DEVICE AND ENCODER FOR CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 773,929

[22] Filed: Dec. 30, 1996

[30] Foreign Application Priority Data

| Jan. 26, 1996 | [JP] | Japan | 8-012317 |
| Feb. 14, 1996 | [JP] | Japan | 8-027135 |
| Feb. 16, 1996 | [JP] | Japan | 8-029488 |
| Mar. 14, 1996 | [JP] | Japan | 8-057879 |

[51] Int. Cl.$^6$ ........................... G03B 9/02
[52] U.S. Cl. ............... 396/508; 250/231.14
[58] Field of Search ............... 396/240, 244, 396/256, 257, 259, 260, 463, 505, 508; 250/231.17, 231.14

[56] References Cited

U.S. PATENT DOCUMENTS

| 4,557,573 | 12/1985 | Johnson et al. |  |
| 4,699,490 | 10/1987 | Kataoka et al. | 396/508 |
| 4,831,400 | 5/1989 | Takami et al. | 396/508 |
| 5,113,216 | 5/1992 | Murata | 396/508 |
| 5,159,192 | 10/1992 | Nishimura et al. |  |
| 5,202,721 | 4/1993 | Kobayashi et al. |  |
| 5,241,172 | 8/1993 | Lugaresi |  |
| 5,262,812 | 11/1993 | Yoshimi |  |
| 5,331,154 | 7/1994 | Kondo et al. | 250/231.17 |
| 5,557,360 | 9/1996 | Kobayashi |  |

FOREIGN PATENT DOCUMENTS

| 0481884 | 4/1992 | European Pat. Off. |
| 1088001 | 10/1967 | United Kingdom . |
| 2157039 | 10/1985 | United Kingdom . |
| 2217837 | 11/1989 | United Kingdom . |
| 2234345 | 1/1991 | United Kingdom . |

OTHER PUBLICATIONS

Copy of French Search Report, dated Jan. 21, 1998.

*Primary Examiner*—A. A. Mathews
*Attorney, Agent, or Firm*—Greenblum & Bernstein P.L.C.

[57] ABSTRACT

An exposure controlling device includes, an aperture diaphragm that is driven by a motorized driving mechanism to open and close, an encoder for detecting an actuation of the motorized driving mechanism comprising a photocoupler and a rotating disk mounted in connection with the photocoupler. The rotating disk rotates corresponding to the actuation of the motorized driving mechanism by less than one full turn, and the rotating disk has a first angular range where the output signal from the photocoupler does not vary even when the rotating disk rotates and a second angular range where the output signal from the photocoupler varies in cycles in accordance with the rotation of the rotating disk. A controlling unit is provided to control the motorized driving mechanism to drive the aperture diaphragm in accordance with signals received from the photocoupler. The photocoupler faces to the first angular range when the aperture diaphragm is set at an p redetermined initial position.

48 Claims, 34 Drawing Sheets

EXPOSURE CONTROLLING DEVICE AND ENCODER FOR CAMERA

BACKGROUND OF THE INVENTION

The present invention relates to an exposure controlling device for a camera that controls an aperture diaphragm driven by a motorized driving mechanism. The present invention also related to an encoder used in the exposure controlling device to detect the actuation of the aperture diaphragm.

Such a camera is provided with a detector for detecting an aperture area of the aperture diaphragm to control it in a closed loop manner. In a lens shutter camera, a lens shutter having shutter blades functions as a shutter and a aperture diaphragm. Such a lens shutter camera is provided with a detector for detecting an aperture area of the shutter. An encoder is used as the detector in general.

The encoder is provided with a rotating disk on which a plurality of slits are formed to be arranged along a circumferential direction and a photointerrupter positioned such that a light emitting element and a light receiving element are faced to each other via the rotating disk therebetween. The rotating disk mechanically links to a gear train of a shutter driving mechanism and is rotated in response to the actuation of the driving mechanism. A rotation amount of the disk, which corresponds to the variation of the aperture area of the shutter, can be detected by counting pulses output from the photointerrupter. And thus, the aperture area can be detected by counting the pulses from a predetermined initial position. The initial position of an aperture diaphragm is defined as a stand-by position before an exposure. In case of the lens shutter, the shutter blades are fully closed at the initial position.

However, in the conventional encoder, since the slits are formed on the rotating disk in a full angular range along a circumference and the rotating disk rotates by a few turns, a control unit can only detect a relative rotation amount of the rotating disk and it cannot detect the initial point accurately even if the pulses are counted. Because the rotating disk does not always return to the correct position after the shutter actuation due to step out i.e., a counter fails to count pulses, backlash of the gear train or the rebound of the mechanism when driving stops. And thus, an additional detector for detecting the initial point besides the encoder is required in the conventional exposure controlling device. It increases a number of components and thus increases a cost.

SUMMARY OF THE INVENTION

It is therefore an object of the present invention to provide an improved exposure controlling device and an encoder which can accurately detect the start position of an aperture diaphragm without using an additional detector besides the encoder.

In an aspect of an exposure controlling device according to the present invention, a camera has an aperture diaphragm that is driven by a motorized driving mechanism to open and close, an encoder for detecting an actuation of the motorized driving mechanism comprises a sensor and a rotating disk mounted in connection with the sensor. the rotating disk rotates corresponding to the actuation of the motorized driving mechanism by less than one full turn. and the rotating disk has a first angular range where the output signal from the sensor does not vary even when the rotating disk rotates and a second angular range where the output signal from the sensor varies in accordance with the rotation of the rotating disk. A controlling unit is provided to control the motorized driving mechanism to drive the aperture diaphragm in accordance with signals received from the sensor. The sensor faces to the first angular range when the aperture diaphragm is set at a predetermined initial position.

With this arrangement, since the controlling unit can always initialize the counter of the signals such as pulses from the sensor when the rotating disk returns to the initial position where the sensor faces to the first angular range, the controlling unit can start to count from the boundary of the first and second angular ranges. Therefore, the controlling unit can accurately detect the aperture diameter based on the signals from the sensor. The step out can be canceled by initializing the counter at the initial position, and the affection of the backlash or the rebound does not rise because the signal count always starts under the condition where the rotating disk rotates in the same direction.

In a particular case, the aperture diaphragm comprises a lens shutter having shutter blades that functions as an aperture diaphragm and a shutter. In this case, the shutter blades are fully closed at the initial position and the controlling unit controls, at the time of an exposure, the motorized driving mechanism to open the shutter blades and then to close them.

In another particular case, a detent mechanism that positions the rotating disk at the initial position is provided. Preferably, the detent mechanism comprises a flat surface portion formed on a rotating shaft of the rotating disk such that the flat surface portion is parallel to a rotation axis of the rotating shaft, and a spring loaded locking member that contacts with the rotating shaft, and the locking member contacts with the flat surface portion when the rotating disk is positioned at the initial position.

With this arrangement, the initial position is determined more accurately.

In further particular case, the second angular range is provided with a pattern that changes the output level of the signals from the sensor in constant cycles with rotating the rotating disk.

In still further particular case, the second angular range is provided with a pattern that changes the output level of signals from the sensor in variable intervals with rotating the rotating disk. Preferably, the intervals gradually increases as the aperture area of the aperture diaphragm increases.

When the sensor comprises a photocoupler, the second angular range is provided with a light modulating pattern.

DETAILED DESCRIPTION OF THE PREFERRED EMBODIMENTS

Preferred embodiments of an exposure controlling device are described as applied to a lens-shutter type zoom lens camera.

Figure 11:
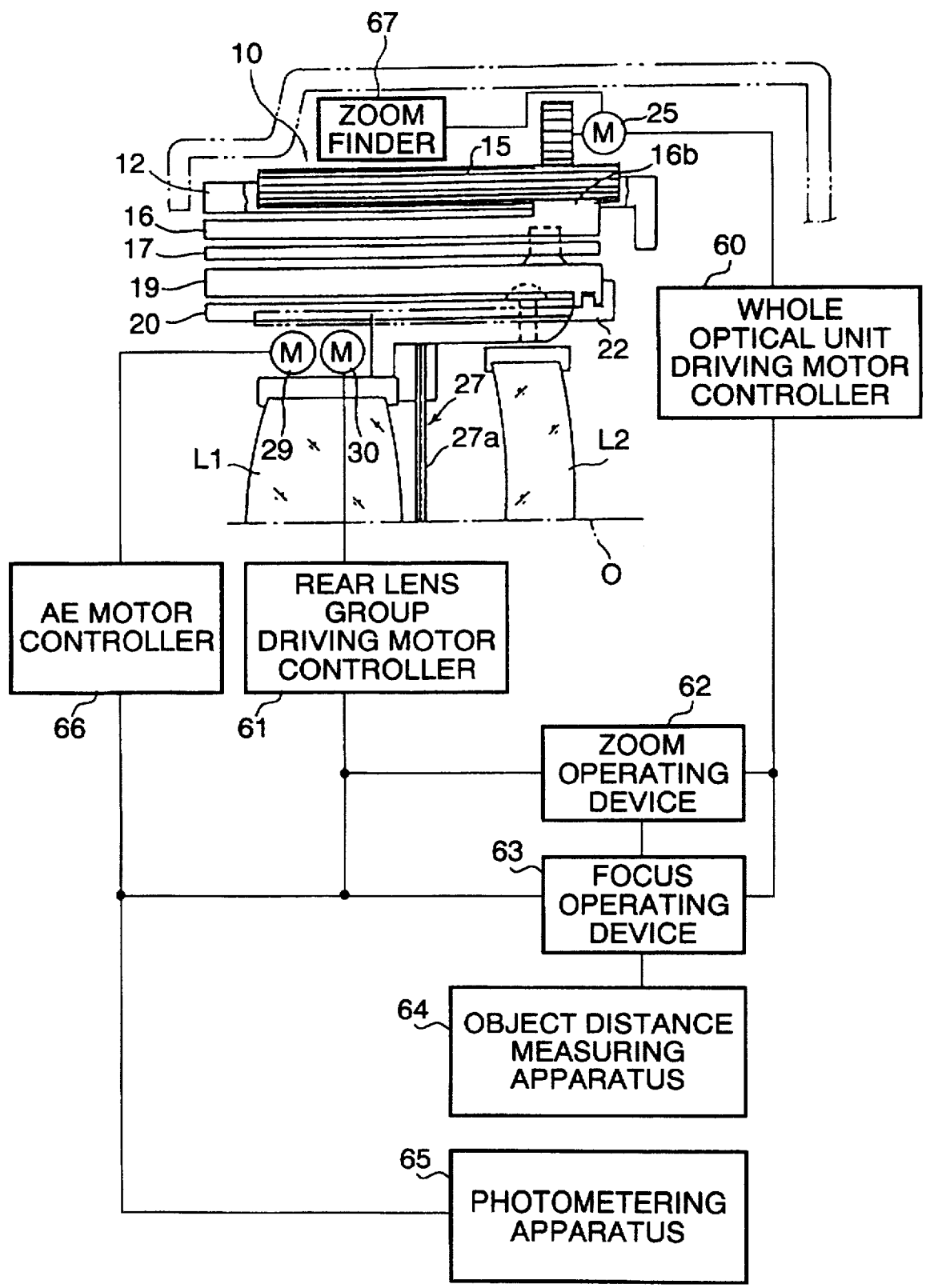
FIG. 11 is a block diagram of a controlling system for controlling an operation of the zoom lens barrel.

FIG. 11 is a schematic representation of various elements which comprise a zoom lens camera. The concept of the zoom lens camera will now be described with reference to FIG. 11.

The zoom lens camera is provided with a zoom lens barrel 10 of a three-stage delivery type having three movable barrels, namely a first movable barrel 20, a second movable barrel 19 and a third movable barrel 16, which are concentrically arranged in this order from an optical axis O. In the zoom lens barrel 10, two lens groups are provided, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be perceived by a value indicated on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. Due to the driving of the whole optical unit driving motor controller 60 and the rear lens group driving motor controller 61, the front and rear lens groups L1 and L2 are moved to respective positions corresponding to a set focal length and a detected object distance and thereby the zoom lens is focused on the object.

Specifically, the focus operating device 63 is provided with a release button (not shown) provided on an upper wall of the camera body. A photometering switch and a release switch (both not shown) are synchronized with the release button. When the release button is half-depressed (half step), the photometering switch is turned ON, and the object distance measuring and photometering commands are respectively input to the object distance measuring apparatus 64 and the photometering apparatus 65.

When the release button is fully depressed (full step), the release switch is turned ON, and according to the result of object distance measuring command and a set focal length, the whole optical unit driving motor 25 and the rear lens group driving motor 30 are driven, and the focusing operation, in which the front lens group L1 and the rear lens group L2 move to the focusing position, is executed. Further, an AE motor 29 of an AF/AE (i.e., autofocus/autoexposure) shutter unit 21 (FIG. 9) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole in the direction of the optical axis O (optical axis direction). Simultaneous with such a movement, the rear lens group driving motor 30 may also be driven via the rear lens group driving motor controller 61 to move the rear lens group L2 relative to the first lens group L1. However, this is not performed under the conventional concept of zooming, in which the focal length is varied sequentially while keeping an in-focus condition. When the zoom operating device 62 is operated, the front lens group L1 and the rear lens group L2 move in the optical axis direction, without varying the distance therebetween, by driving only the whole optical unit driving motor 25.

During the zooming operation, an in-focus condition cannot be obtained at all times with respect to an object located at a specific distance. However, this is not a problem in a lens-shutter type camera, since the image of the object is not observed through the photographing optical system, but through the finder optical system, that is provided separate from the photographing optical system, and it is sufficient that the in-focus condition is obtained when the shutter is released. Thus, when the release button is fully depressed, the focusing operation (focus adjusting operation) is carried out by moving at least one of the whole optical unit driving motor 25 and the rear lens group driving motor 30. In such a manner, since each of the two lens groups L1, L2 can be driven independently, when the focus operating device 63 is operated, the position of the lens groups L1, L2 can be flexibly controlled.

An embodiment of the zoom lens barrel according to the above concept will now be described with reference to mainly FIGS. 9 and 10.

The overall structure of the zoom lens barrel 10 will firstly be described.

The zoom lens barrel 10 is provided with the first movable barrel 20, the second movable barrel 19, the third movable barrel 16, and a fixed lens barrel block 12. The third movable barrel 16 is engaged with a cylindrical portion 12p of the fixed lens barrel block 12, and moves along the optical axis O upon being rotated. The third movable barrel 16 is provided on an inner periphery thereof with a linear guide barrel 17, which is restricted in rotation. The linear guide barrel 17 and the third movable barrel 16 move together as a whole along the optical axis O, with the third movable barrel 16 rotating relative to the linear guide barrel 17. The first movable barrel 20 moves along the optical axis O with rotation thereof being restricted. The second movable barrel 19 moves along the optical axis O, while rotating relative to the linear guide barrel 17 and the first movable barrel 20. The whole optical unit driving motor 25 is secured to the fixed lens barrel block 12. A shutter mounting stage 40 is secured to the first movable barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided, on an inner periphery of the cylindrical portion 12p thereof, with a female helicoid 12a, and also a plurality of linear guide grooves 12b each extending parallel to the optical axis O, i.e. extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 7:
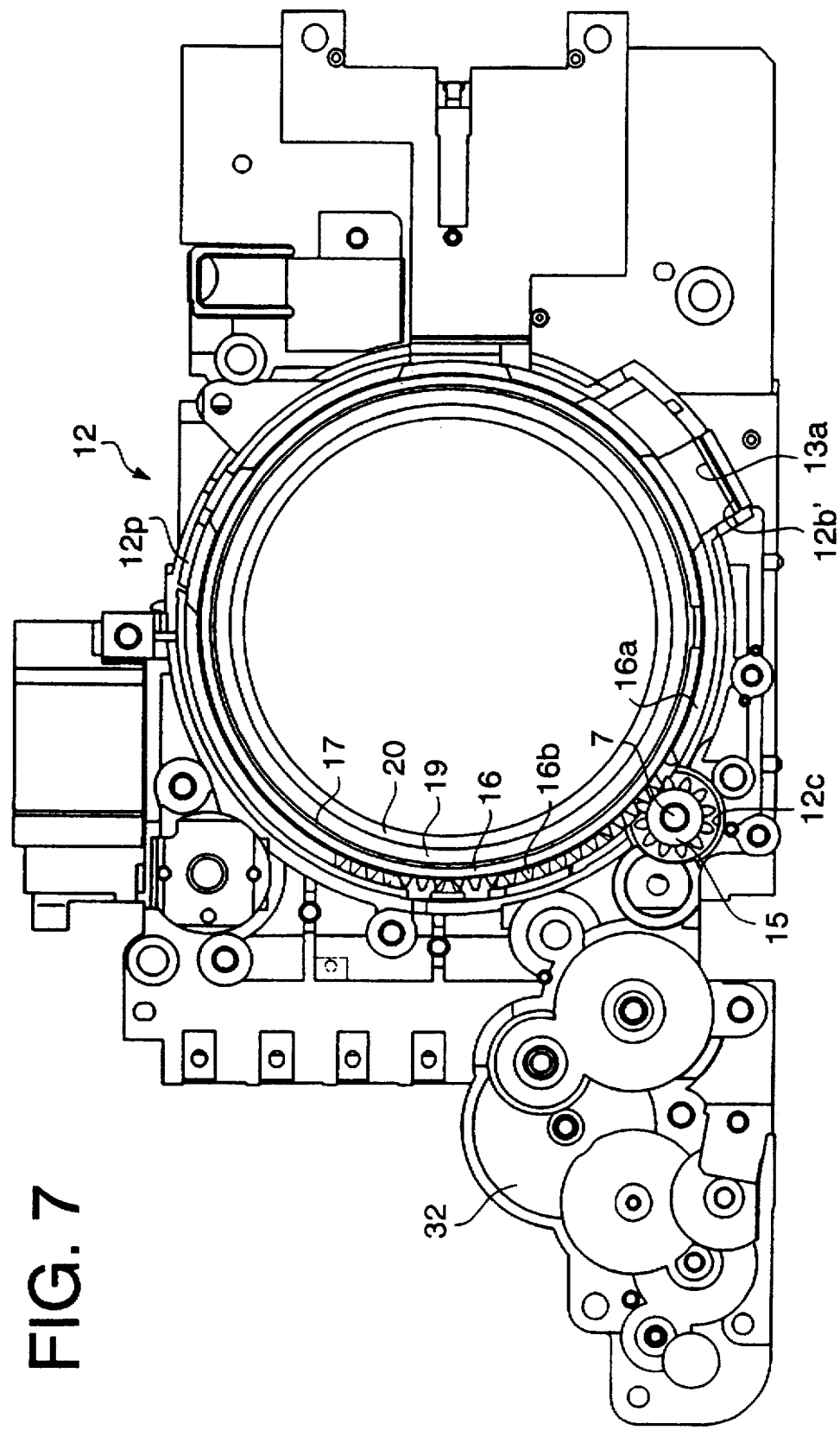
FIG. 7 is a front view of a fixed lens barrel block of the zoom lens barrel.
Figure 10:
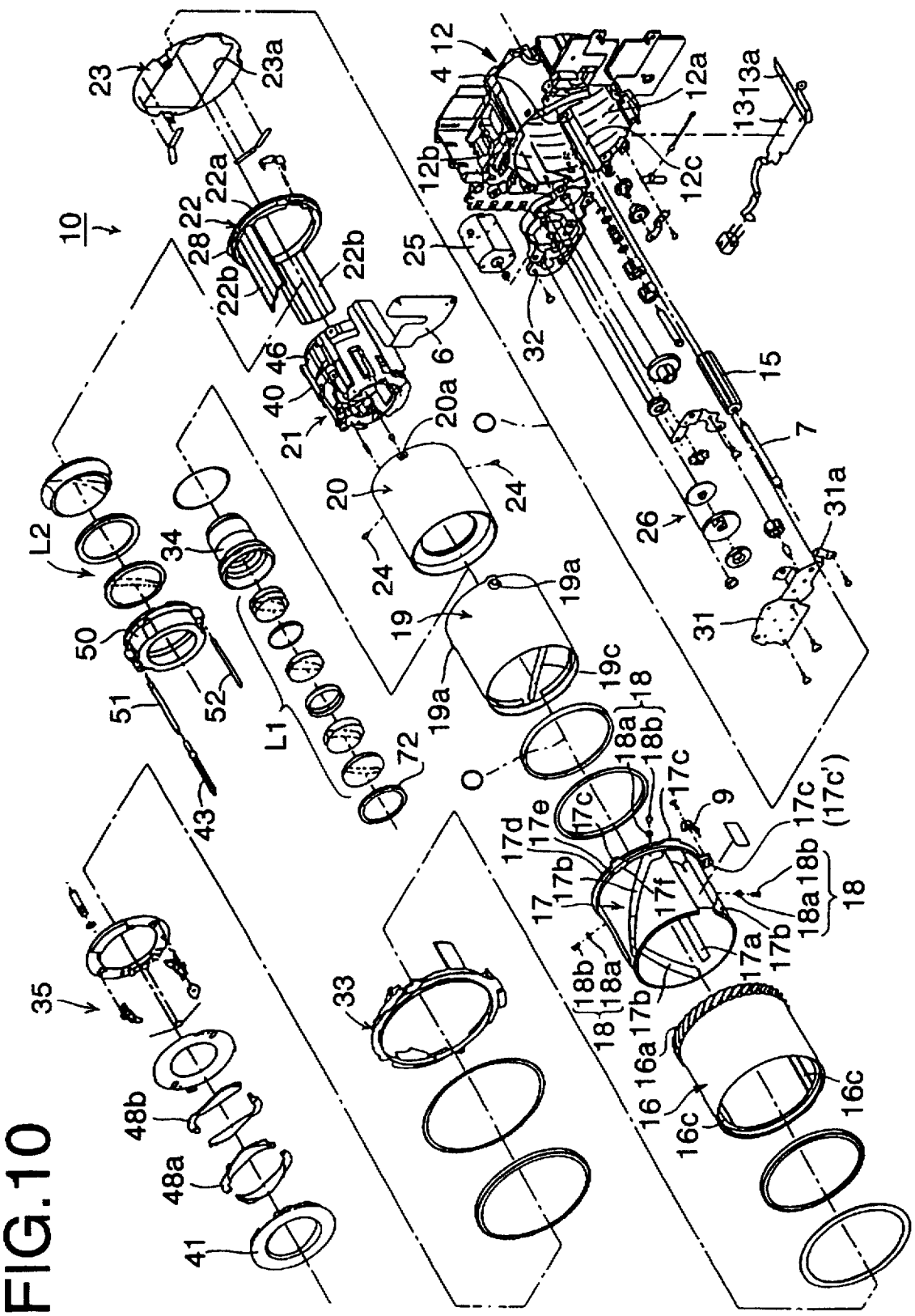
FIG. 10 is an exploded perspective view of the overall structure of the zoom lens barrel.

In the fixed lens barrel block 12, a gear housing 12c, which is recessed outwardly from an inner periphery of the cylindrical portion 12p of the fixed lens barrel block 12 in a radial direction while extending in the optical axis direction, is provided as shown in FIG. 7 or 10. In the gear housing 12c, a driving pinion 15, extending in the optical axis direction, is rotatably positioned. Both ends of an axial shaft 7 of the driving pinion 15 are rotatably supported, by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion of the fixed lens barrel block 12, so that the driving pinion 15 meshes with an outer peripheral gear 16b of the third movable barrel 16, as shown in FIG. 7.

Figure 6:
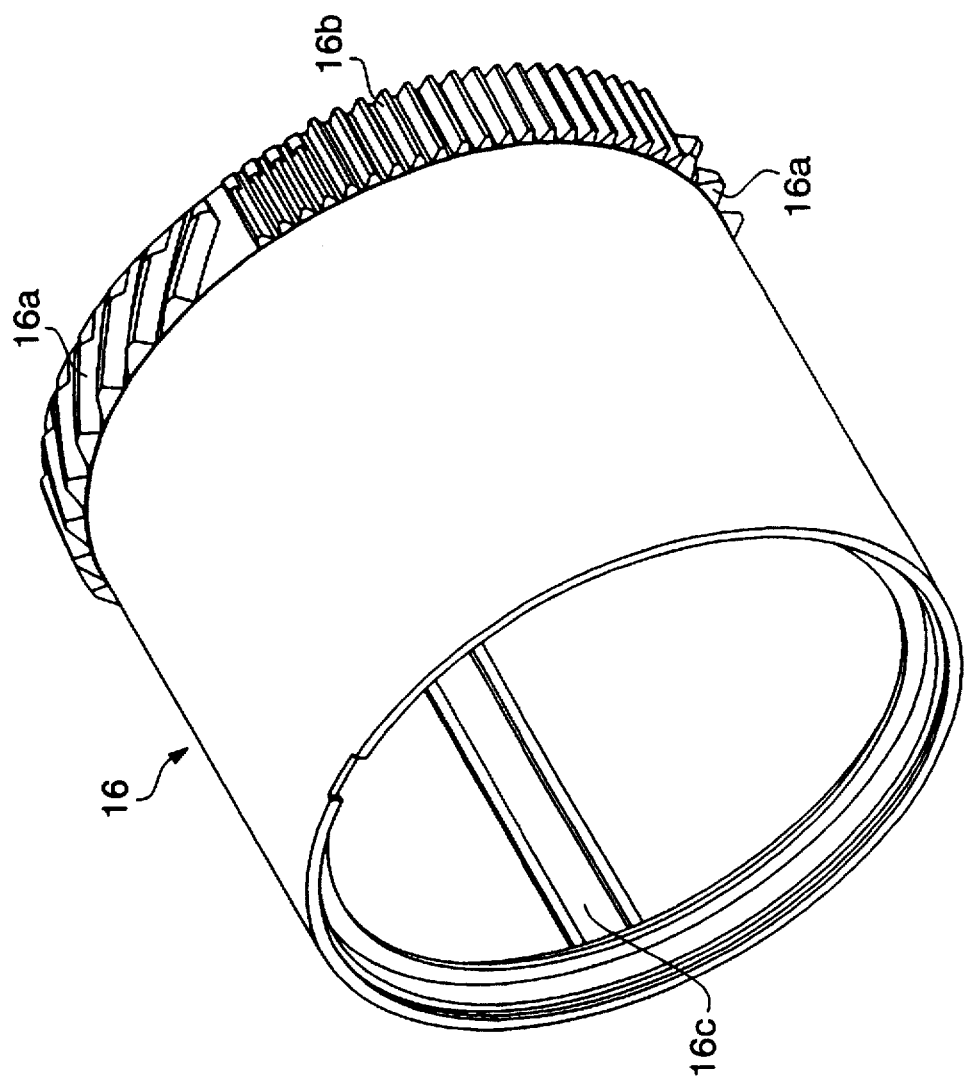
FIG. 6 is an external schematic perspective view of a third movable barrel of the zoom lens barrel.

On an inner periphery of the third movable barrel 16, a plurality of linear guide grooves 16c, each extending parallel to the optical axis O, are formed. At an outer periphery of the rear end of the third movable barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third movable barrel 16 in the optical axis direction.

As shown in FIG. 10, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided, in front of the rear end flange 17d, with an anti-dropping flange 17e. A circumferential groove 17g is formed between the rear end flange 17d and the anti-dropping flange 17e. The anti-dropping flange 17e has a radius smaller than the rear end flange 17d. The anti-dropping flange 17e is provided with a plurality of cutout portions 17f. Each of the cutout portions 17f allows a corresponding engaging projection 16d to be inserted into the circumferential groove 17g, as shown in FIG. 9.

The third movable barrel 16 is provided, on an inner periphery of the rear end thereof, with the plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (See FIG. 9). By rotating the third movable barrel 16 relative to the linear guide barrel 17, the engaging projections 16d are engaged with the linear guide barrel 17.

On the rear end of the linear guide barrel 17, an aperture plate 23 having a rectangular-shaped aperture 23a approximately the same shape as the aperture 14a, is fixed.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis O. A plurality of lead slots 17b are also formed on the linear guide barrel 17 as shown in FIG. 10. The lead slots 17b are each formed oblique (inclined) to the optical axis O.

The second movable barrel 19 engages with the inner periphery of the linear guide barrel 17. On the inner periphery of the second movable barrel 19, a plurality of lead grooves 19c are provided in a direction inclined oppositely to the lead slots 17b. On the outer periphery of the rear end of the second movable barrel 19 a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third movable barrel 16. With such an arrangement, when the third movable barrel 16 rotates, the second movable barrel 19 moves linearly in the optical axis direction, while rotating.

On the inner periphery of the second movable barrel 19, the first movable barrel 20 is engaged. The first movable barrel 20 is provided, on an outer periphery of the rear thereof, with a plurality of follower pins 24 each engaging with the corresponding inner lead groove 19c, and at the same time the first movable barrel 20 is guided linearly by a linear guide member 22. The first movable barrel 20 is provided at the front end thereof with a decorative plate 41.

Figure 1:
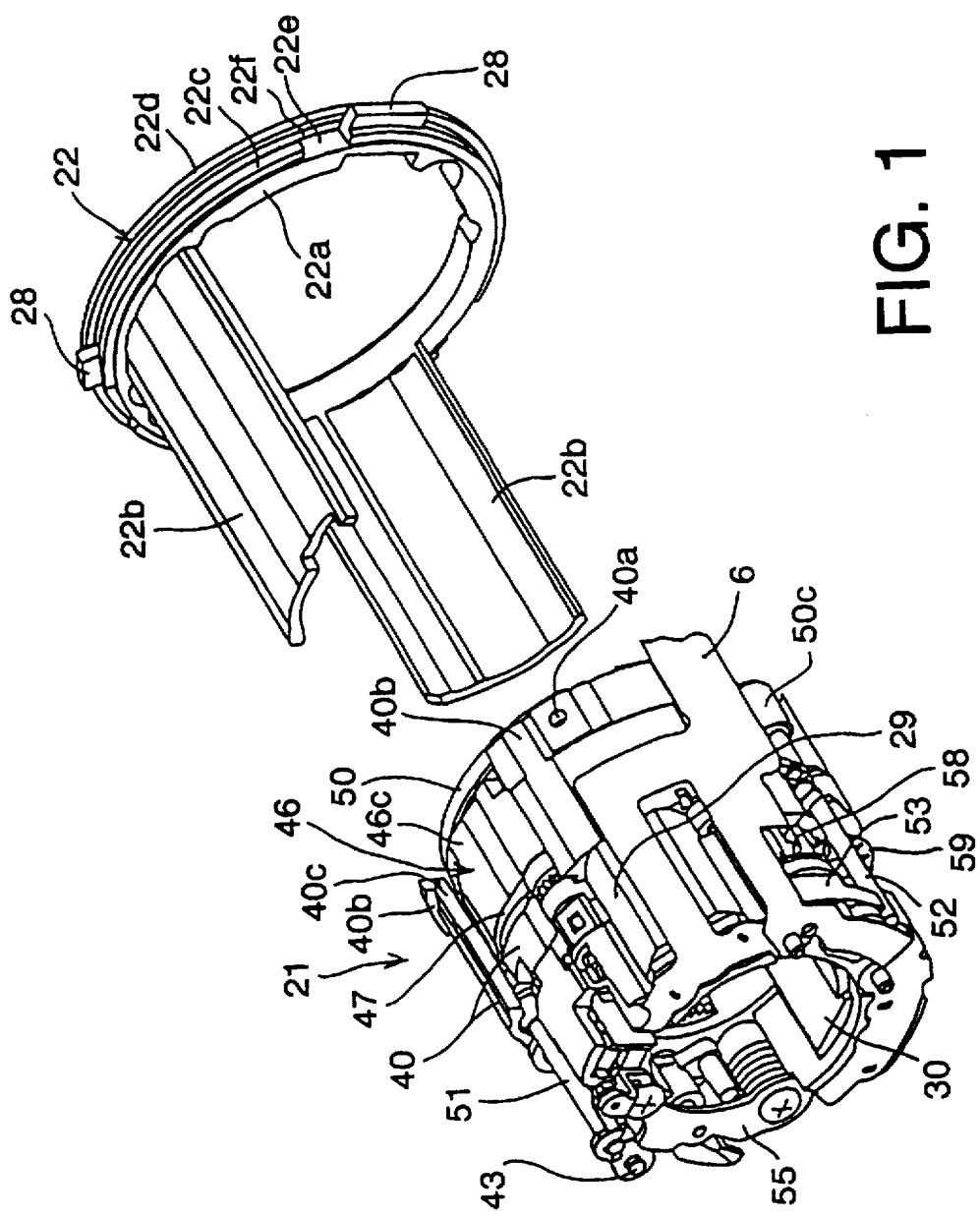
FIG. 1 is an enlarged schematic perspective view showing a part of a zoom lens barrel.
Figure 2:
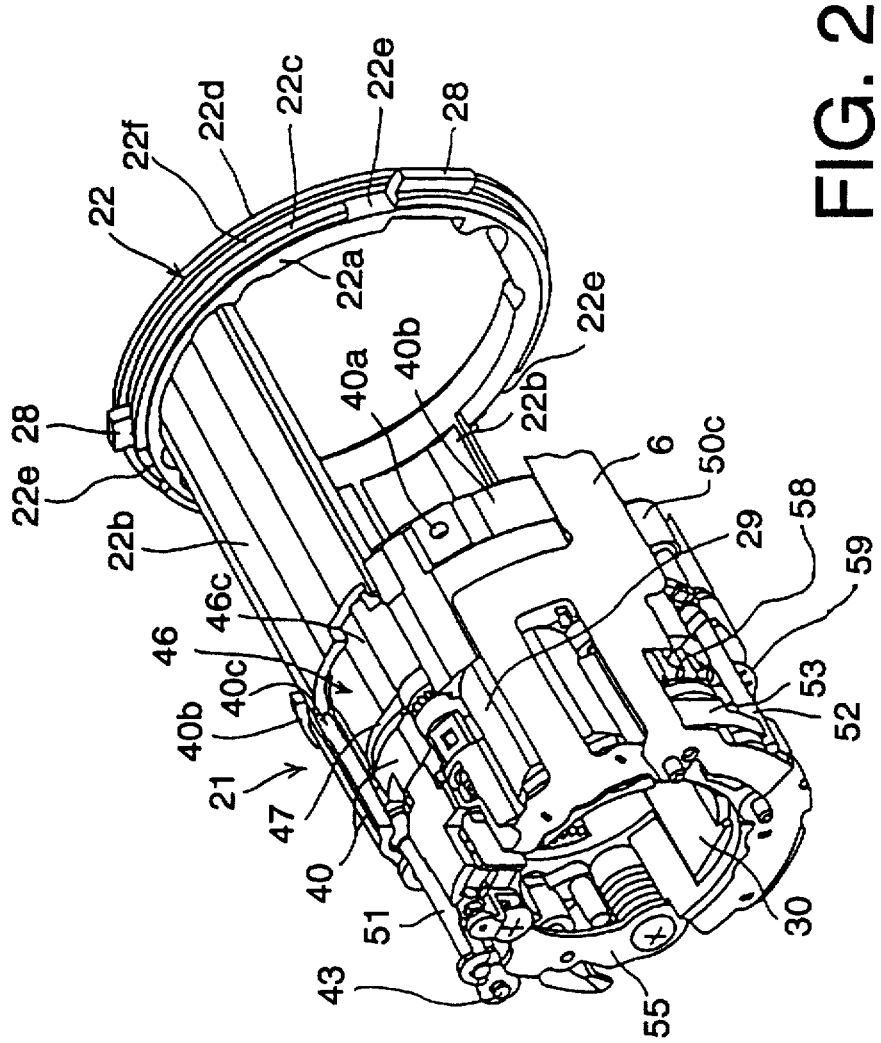
FIG. 2 is a schematic perspective view showing the part of the zoom lens barrel shown in FIG. 1 in an engaged state.
Figure 3:
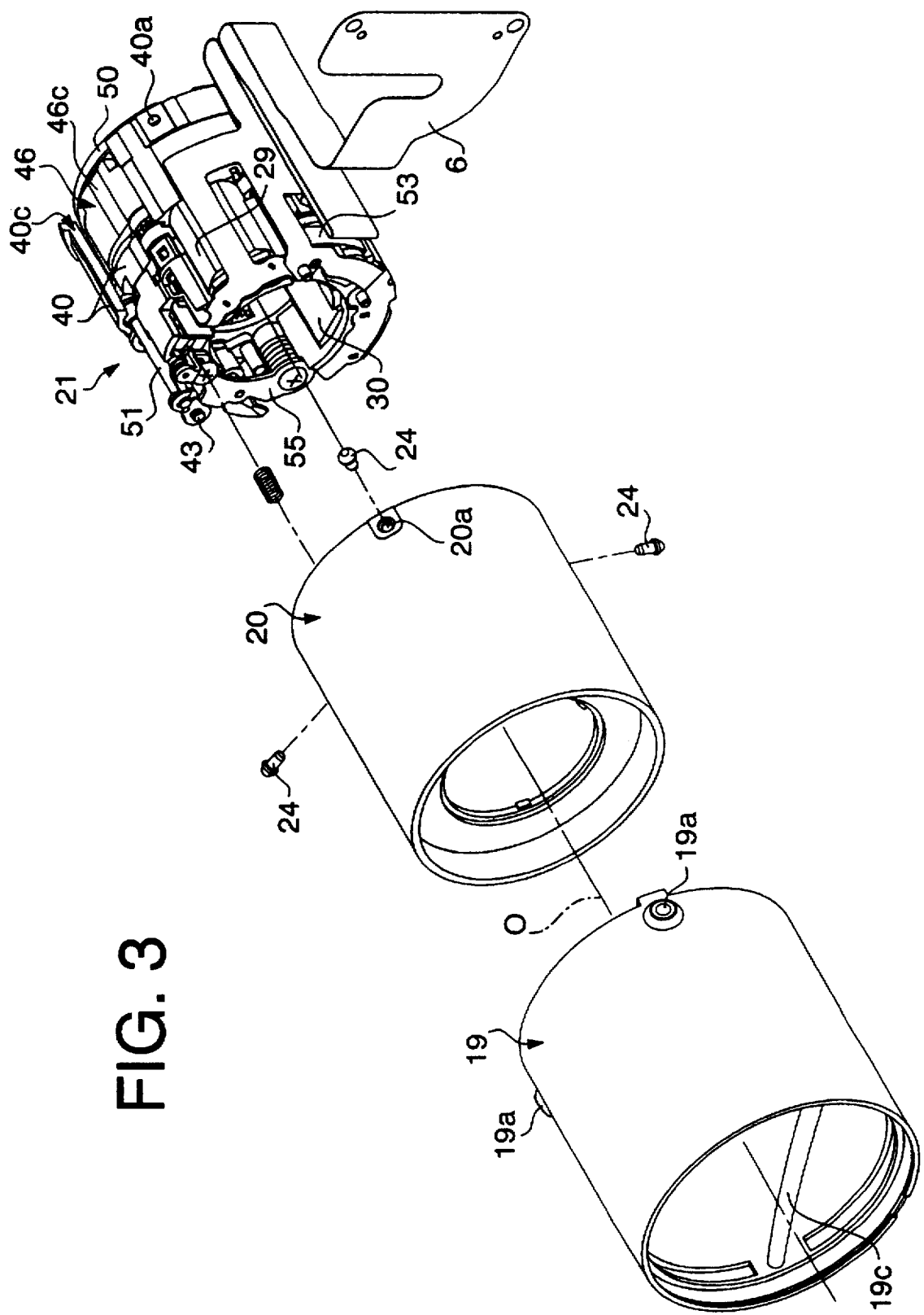
FIG. 3 is an enlarged exploded perspective view showing a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first movable barrel 20 and the AF/AE shutter unit 21.

The annular member 22a of the linear guide member 22 is connected to the rear of the second movable barrel 19, such that the linear guide member 22 and the second movable barrel 19 are capable of moving along the optical axis O as a whole, and in addition are capable of relatively rotating around the optical axis O. The linear guide member 22 is further provided, on the outer periphery of the rear end thereof, with a rear end flange 22d. The linear guide member 22 is further provided, in front of the rear end flange 22d, with an anti-dropping flange 22c. A circumferential groove 22f is formed between the rear end flange 22d and the anti-dropping flange 22c. The anti-dropping flange 22c has a radius smaller than the rear end flange 22d. The anti-dropping flange 22c is provided with a plurality of cutout portions 22e, as shown in FIG. 1 or 2, each allowing a corresponding engaging projection 19b to be inserted into the circumferential groove 22f, as shown in FIG. 9.

The second movable barrel 19 is provided, on an inner periphery of the rear end thereof, with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second movable barrel 19 relative to the linear guide member 22, the engaging projections 19b are engaged with the linear guide member 22. With the above structure, when the second movable barrel 19 rotates in the forward or reverse rotational direction, the first movable barrel 20 moves linearly, forwardly or rearwardly along the optical axis O, bust is restricted from rotating.

Figure 8:
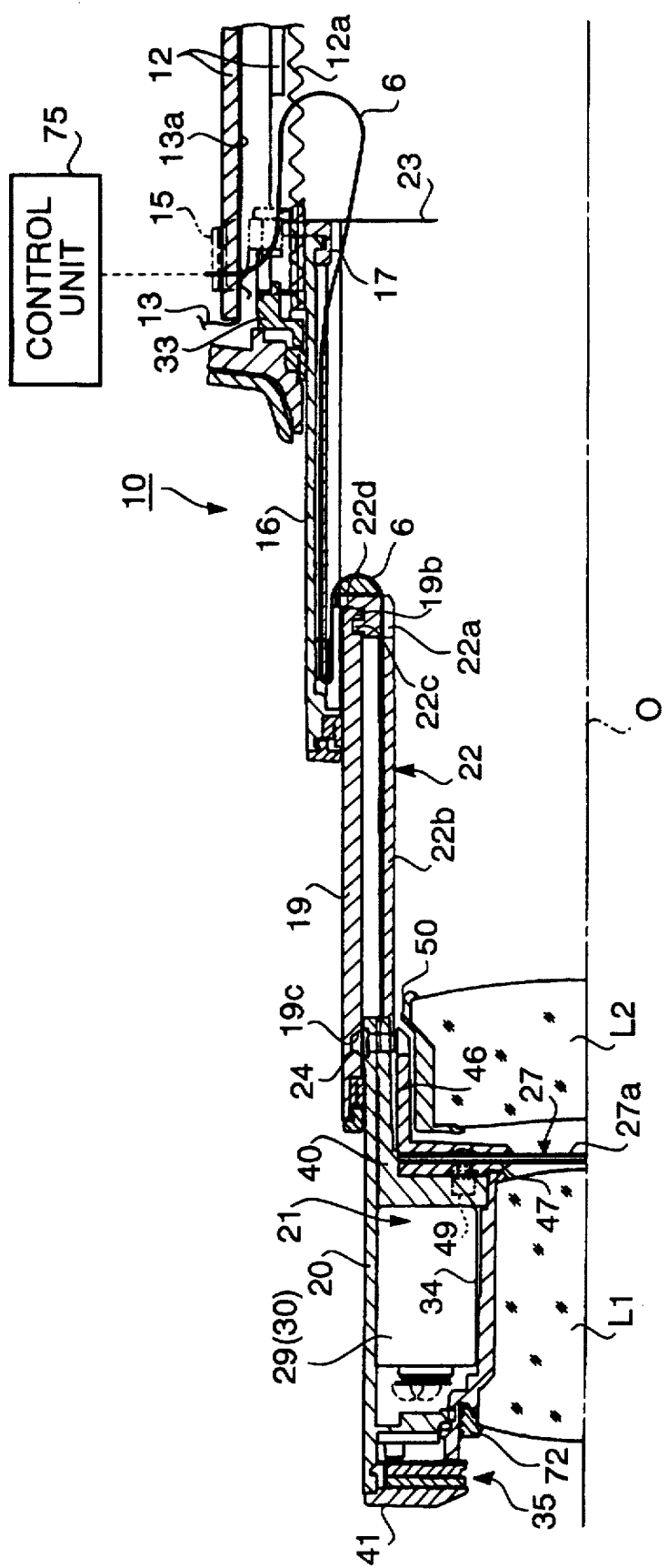
FIG. 8 is a sectional view of an upper part of the zoom lens barrel in a maximum extended state.

At the front of the first movable barrel 20, a barrier apparatus 35 having barrier blades 48a and 48b is mounted. on an inner peripheral face of the first movable barrel 20 the AF/AE shutter unit 21 having the shutter 27, consisting of three shutter blades 27a, is engaged and fixed, as shown in FIG. 8. The AF/AE shutter unit 21 is provided with a plurality of fixing holes 40a formed at even angular intervals on the outer periphery of the shutter mounting stage 40. Only one of the fixing holes 40a appears in each of FIGS. 1 through 5.

Figure 4:
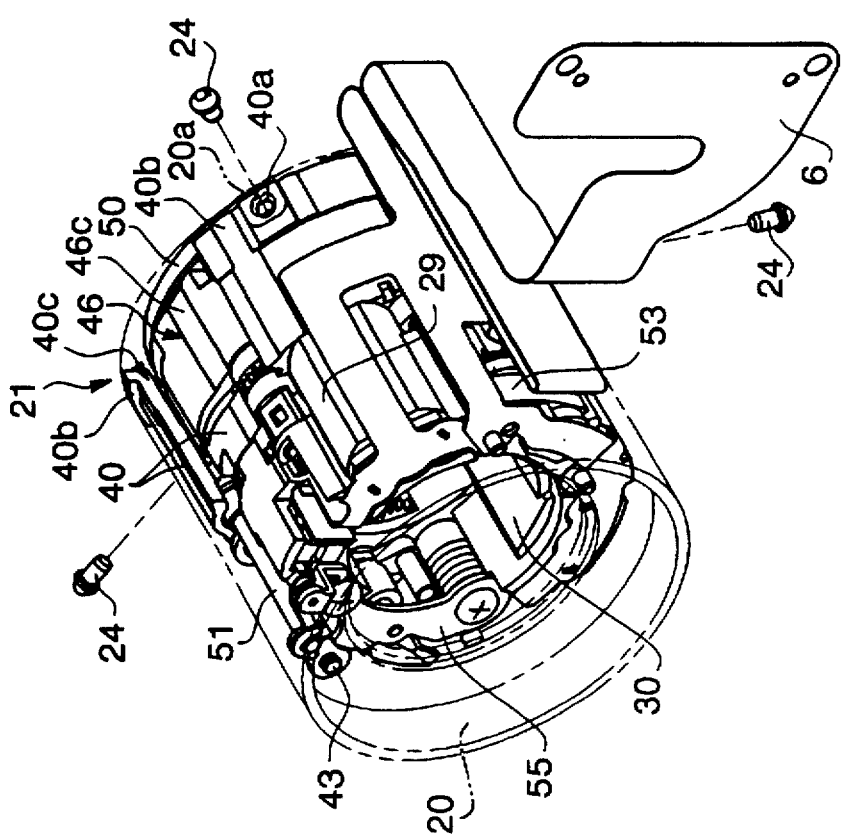
FIG. 4 is a schematic perspective view illustrating a state where an AF/AE shutter unit of the zoom lens barrel is mounted to a first movable barrel.

The aforementioned plurality of follower pins 24, which engage with the inner lead grooves 19c, also serve as device for fixing the AF/AE shutter unit 21 to the first movable barrel 20. The follower pins 24 are inserted and fixed in holes 20a, formed on the first movable barrel 20, and in the fixing holes 40a. With this arrangement the AF/AE shutter unit 21 is secured to the first movable barrel 20 as shown in FIG. 4. In FIG. 4 the first movable barrel 20 is indicated by phantom lines. The follower pins 24 may be fixed by an adhesive, or the pins 24 may be formed as screws to be screwed into the fixing holes 40a.

Figure 5:
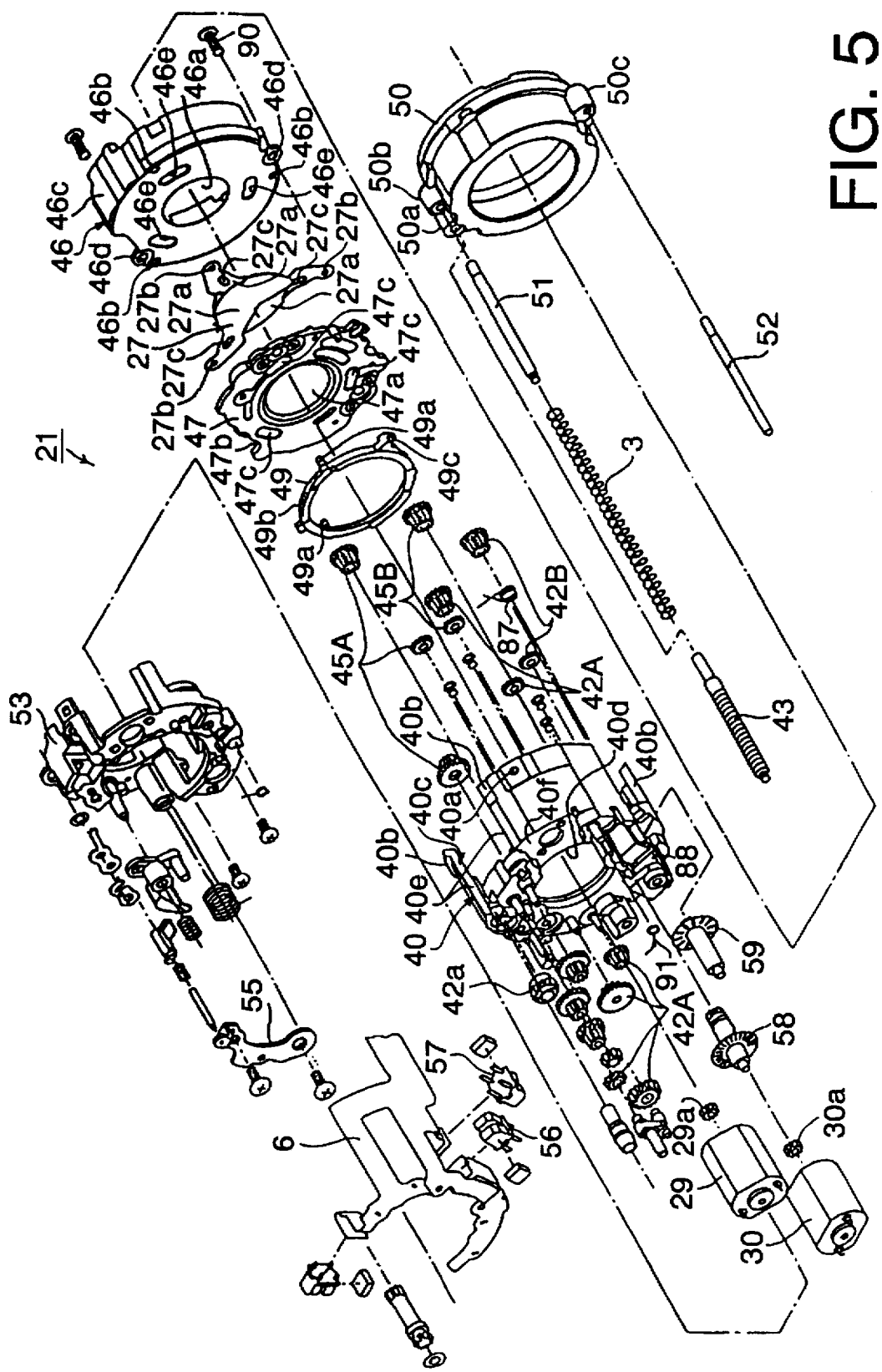
FIG. 5 is an exploded perspective view illustrating main parts of the AF/AE shutter unit of the zoom lens barrel.

As illustrated in FIGS. 5 and 10, the AF/AE shutter unit 21 is provided with the shutter mounting stage 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. On the shutter mounting stage 40, the lens supporting barrel 34, the AE motor 29, and the rear lens group driving motor 30, are supported. The shutter mounting stage 40 is provided, with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22, so as to guide the movement of the linear guide member 22.

The shutter mounting stage 40 supports an AE gear train 45 which transmits a rotation of the AE motor 29 to the shutter 27, a lens driving gear train 42, which transmits rotation of the rear lens group driving motor 30 to a screw shaft 43, photointerrupters 56 and 57, connected to a flexible printed circuit board 6, and rotating disks 58 and 59, having a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the shutter blade supporting ring 46 is provided, at a front end thereof, with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 10) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a, that extends normal to the optical axis O from the pivoted end, is formed as a light-interceptive portion. All three light-interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light-interceptive portion thereof, with a slot 27c, through which the corresponding operating projection 49a is inserted. The supporting member 47 is fixed to the shutter blade supporting ring 46 in such a manner that, each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46d provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole of the driving gear 42a. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws (not shown). The motors 29, 30 and the photointerrupters 56, 57 are connected to the flexible printed circuit board 6. One end of the flexible printed circuit board 6 is fixed to the shutter mounting stage 40.

After the first, second and third movable barrels 20, 19 and 16, and the AF/AE shutter unit 21 and the like are assembled, the aperture plate 23 is fixed to the rear of the linear guide barrel 17, and a supporting member 33 having a circular shape is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens group.

In addition, in the above embodiment, the rear lens group L2 is supported on the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner that the rear lens group L2 is not supported by the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

The operation of the zoom lens barrel 10, by rotation of the whole optical unit driving motor 25 and the rear lens group driving motor 30, will now be described with reference to FIGS. 8 and 9.

Figure 9:
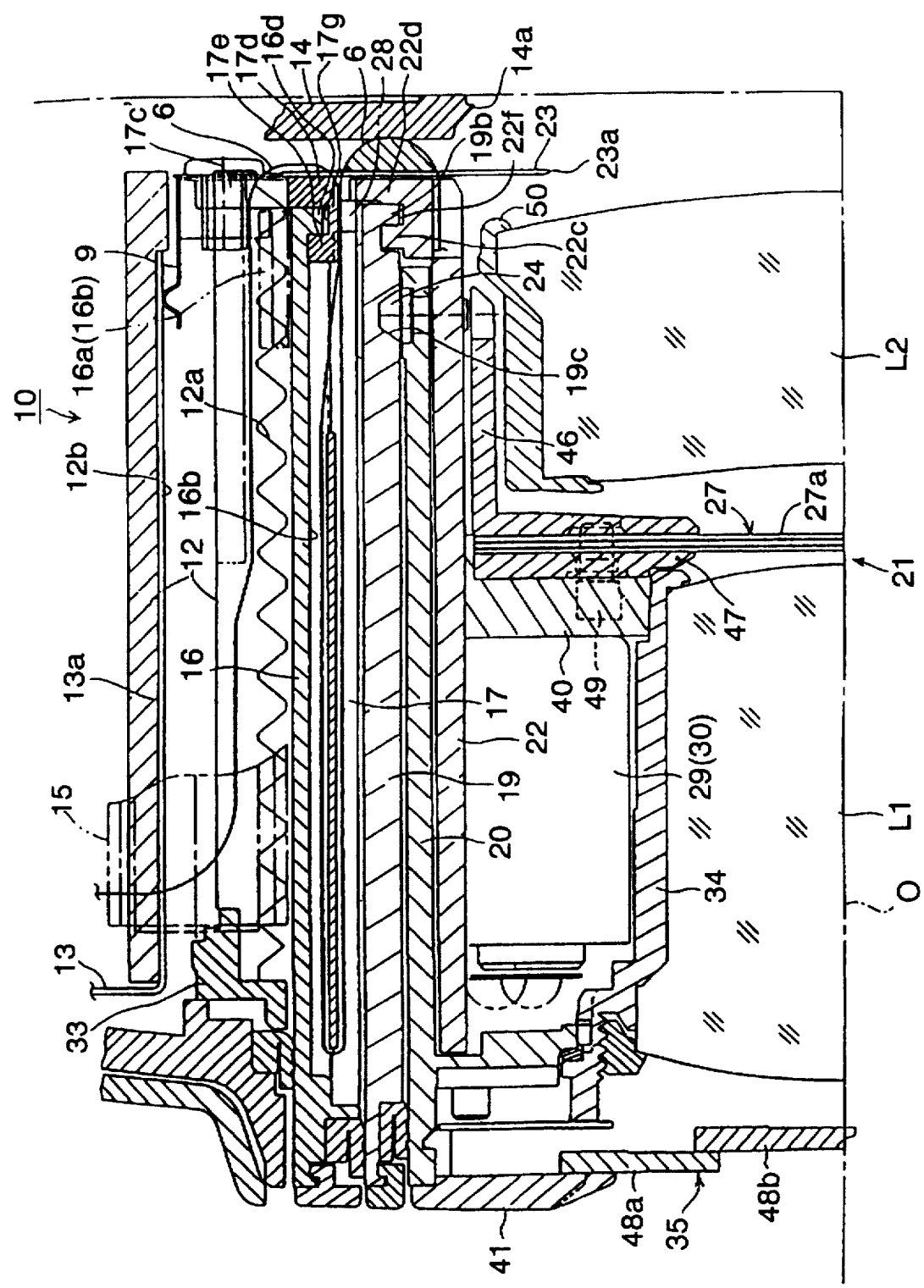
FIG. 9 is a sectional view showing an upper part of the zoom lens barrel in a housed state.

As shown in FIG. 9, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 formed integral with the fixed lens barrel block 12, to thereby rotate the third movable barrel 16 in one predetermined rotational direction to advance forwardly along the optical axis O. Therefore, the second movable barrel 19 and the first movable barrel 20 are each advanced by a small amount in the optical axis direction, along with the third movable barrel 16. Consequently, the camera is in a state capable of photographing, with the zoom lens positioned at the widest position, i.e., the wide end. At this stage, due to the fact that the amount of movement of the linear guide barrel 17, with respect to the fixed lens barrel block 12, is detected through the relative slide between the code plate 13a and the contacting terminal 9, the focal length is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60, so that the third movable barrel 16 rotates in the rotational direction to advance along the optical axis O via the driving pinion 15 and the outer peripheral gear 16b. Therefore, the third movable barrel 16 is advanced from the fixed lens barrel block 12, according to the relationship between the female helicoid 12a and the male helicoid 16a. At the same time, the linear guide barrel 17 moves forwardly along the optical axis O together with the third movable barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second movable barrel 19 to move forwardly relative to the third movable barrel 16 in the optical axis direction, while rotating together with the third movable barrel 16 in the same rotational direction relative to the fixed lens barrel block 12. The first movable barrel 20 moves forwardly along the optical axis O together with the AF/AE shutter unit 21, from the second movable barrel 19, without relative rotation to the fixed lens barrel block 12, due to the above-noted structures in which the first movable barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60, so that the third movable barrel 16 rotates in the rotational direction to retract into the fixed lens barrel block 12 together with the linear guide barrel 17. At the same time, the second movable barrel 19 is retracted into the third movable barrel 16, while rotating in the same direction as that of the third movable barrel 16, and the first movable barrel 20 is retracted into the rotating second movable barrel 19 together with the AF/AE shutter unit 21. During the above retraction driving, like the case of advancing driving as above described, the rear lens group driving motor 30 is not driven.

While the zoom lens barrel 10 is driven during the zooming operation, since the rear lens group driving motor 30 is not driven, the front lens group L1 and the rear lens group L2 move as a whole, maintaining a constant distance between each other, as shown in FIG. 8. The focal length input via the zoom code plate 13a and the contacting terminal 9 is indicated on an LCD panel (not shown) provided on the camera body.

At any focal length, when the release button is depressed by a half-step, the object distance measuring apparatus 64 is actuated to measure an object distance. At the same time the photometering apparatus 65 is actuated to measure an object brightness. Thereafter, when the release button is fully depressed, the whole optical unit driving motor 25 and the rear lens group driving motor 30 are each driven by respective amounts each corresponding to the focal length information set in advance and the object distance information obtained from the object distance measuring apparatus 64, so that the front and rear lens groups L1 and L2 are respectively moved to specified positions to obtain a specified focal length and also bring the object into focus. Immediately after the object is brought into focus, via the AE motor controller 66, the AE motor 29 is driven to rotate the circular driving member 49 by an amount corresponding to the object brightness information obtained from the photometering apparatus 65, so that the shutter 27 is driven to open the shutter blades 27a by a predetermined amount which satisfies the required exposure. Immediately after the three shutter blades 27a are opened and subsequently closed, the whole optical unit driving motor 25 and the rear lens group driving motor 30 are both driven to move the front lens group L1 and the rear lens group L2 to respective initial positions at which they were at prior to a shutter release.

Figure 12:
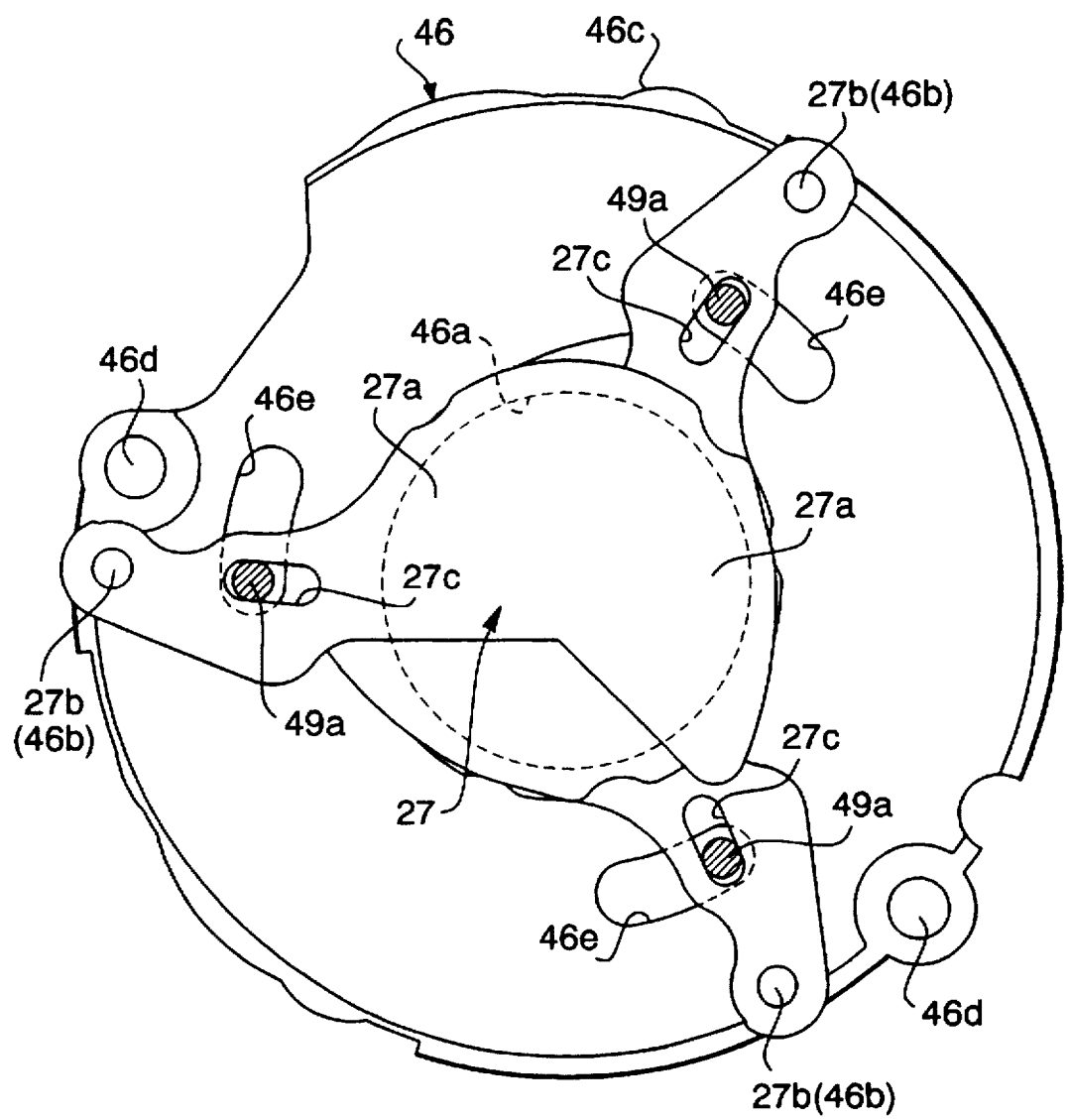
FIG. 12 is a front view showing the shutter assembled on the shutter blade supporting ring in the AF/AE shutter unit.
Figure 13:
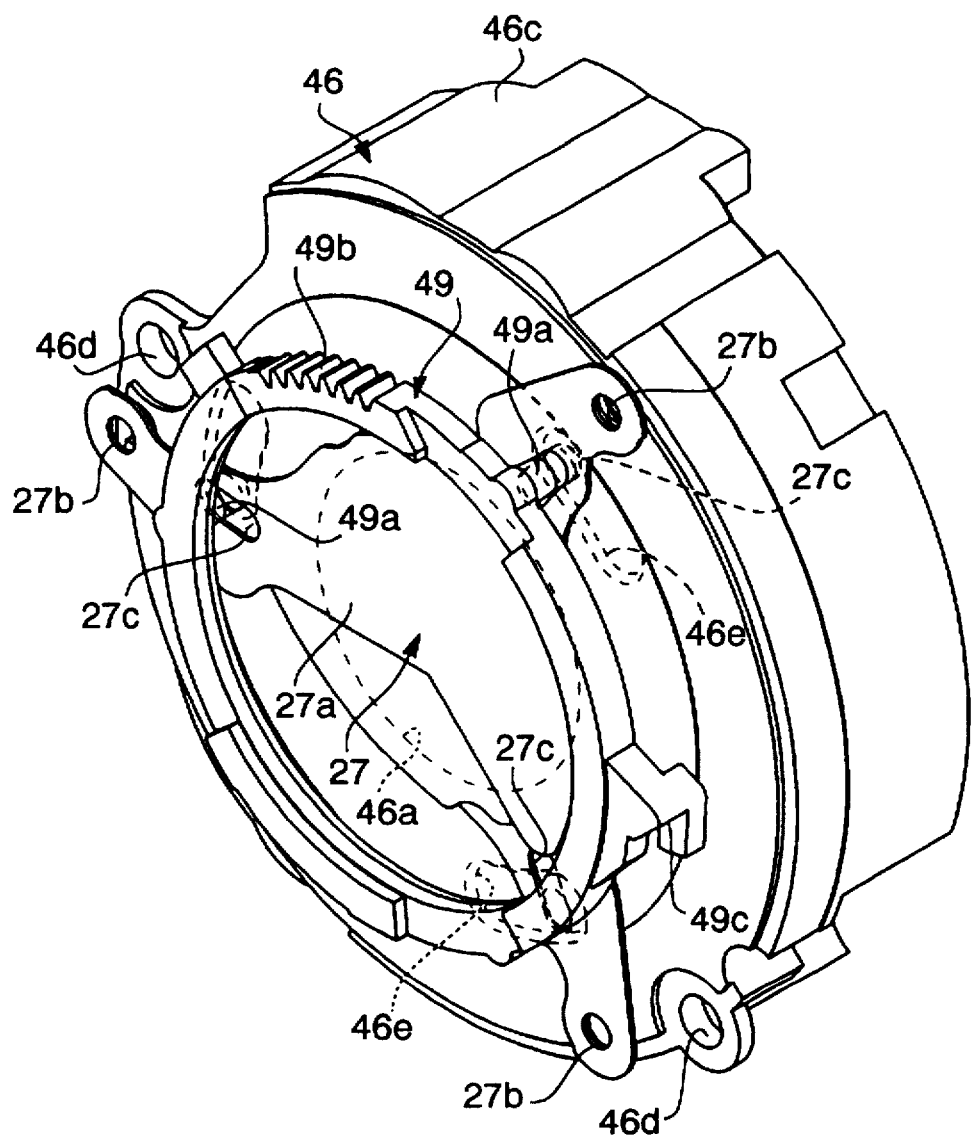
FIG. 13 is a perspective view showing the shutter assembled on the shutter blade supporting ring in the AF/AE shutter unit.

The specific construction of the driving mechanism of the shutter 27 will be described with reference to FIGS. 12–15. The shutter 27 of the embodiment is a lens shutter functions as a shutter and an aperture diaphragm. The shutter 27 comprises, as shown in FIG. 12, three shutter blades 27a that are attached to the shutter blade supporting ring 46. The pivotal shafts 47b of the supporting member 47 are inserted and fixed to the corresponding supporting holes 46b of the shutter blade supporting ring 46 through the corresponding holes 27b of the shutter blades 27a as shown in FIG. 13. Each shutter blade 27a can pivot about the corresponding pivotal shafts 47b.

Figure 19:
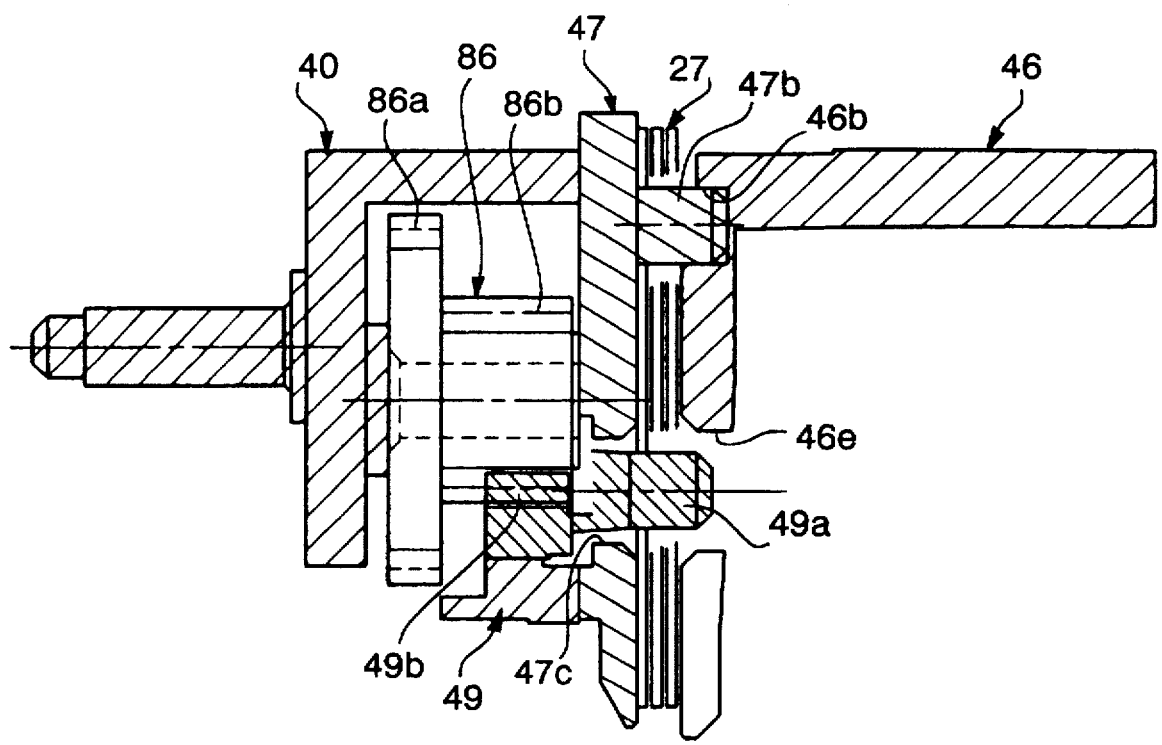
FIG. 19 is a sectional side view showing the engagement of a double gear of an AE gear train with a gear part of an annular driving member.

The circular driving member 49 is rotatably supported between the annular member 40f and the supporting member 47. As shown in FIGS. 13 and 19, the three operating projections 49a of the circular driving member 49 respectively engage with each of the slots 27c of the shutter blades 27a through the respective arc grooves 47c of the supporting member 47. Tip ends of the operating projection 49a pierce escape holes 46e formed on the shutter blade supporting ring 46.

The gear portion 49b is formed on the edge of the circular driving member 49 as shown in FIG. 13 and that is engaged with a small-diameter gear 86b of a double gear 86 that is driven by the AE motor 29 via a gear train as shown in FIG. 19.

Figure 14:
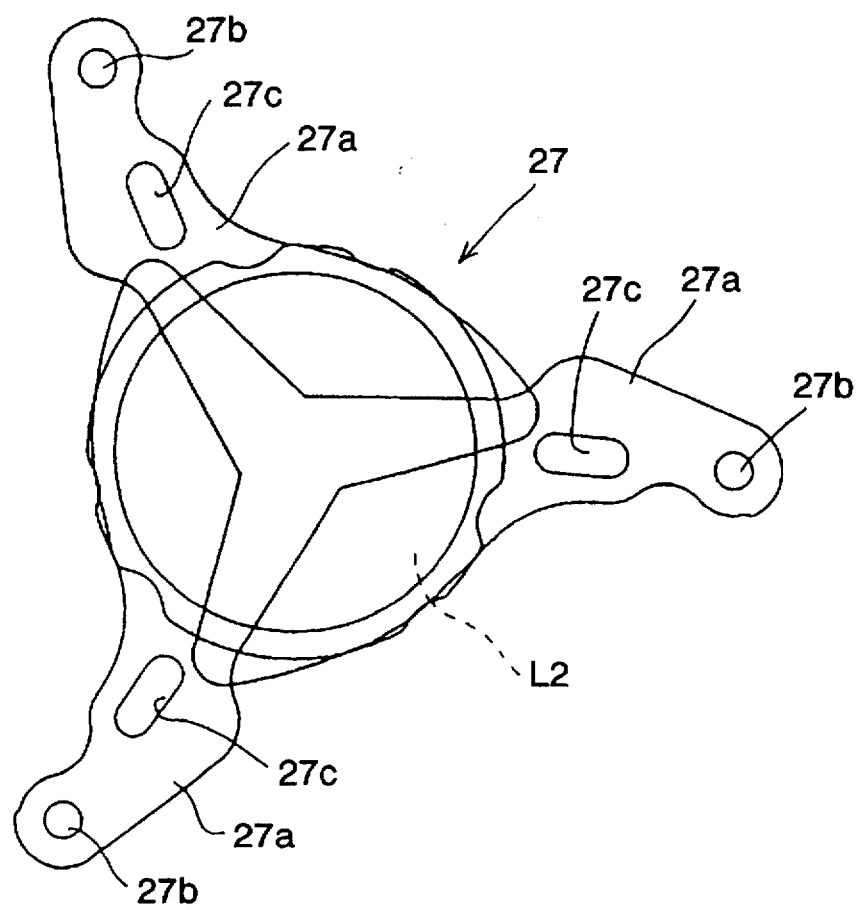
FIG. 14 is a front view showing the fully closed condition of a shutter.

The shutter blades 27a pivot on the pivot shafts 47b as the circular driving member 49 is rotated. In a fully closed condition, the circular aperture 46a is closed by the shutter blades 27a as shown in FIGS. 12 and 13. FIG. 14 shows the locations of the shutter blades 27a with respect to the second lens L2.

Figure 15:
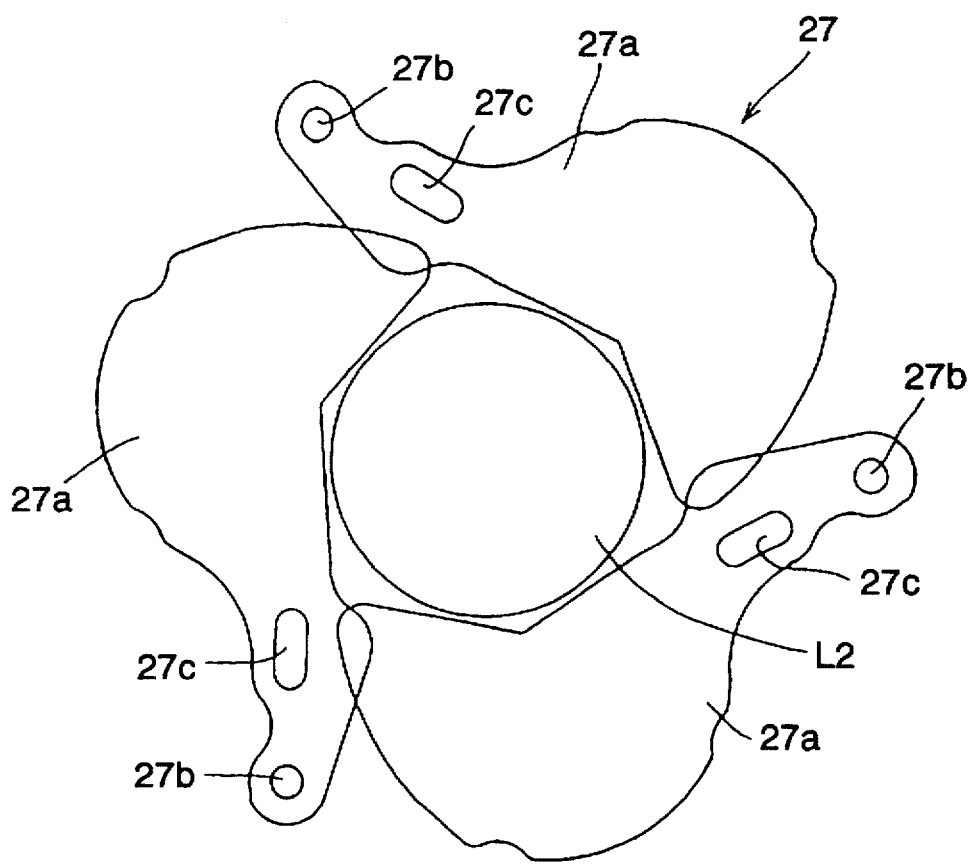
FIG. 15 is a front view showing the fully opened condition of a shutter.

As the circular driving member 49 is rotated in the clockwise direction in FIG. 12, each of the shutter blades 27a pivots in the counterclockwise direction in the figure and the aperture diameter of the shutter 27 gradually increases with the rotation amount of the circular driving member 49 increases. FIG. 15 shows a fully opened condition of the shutter 27. The shutter blades 27a are moved out from the circular aperture 46a, and the rear lens group L2 appears.

Figure 16:
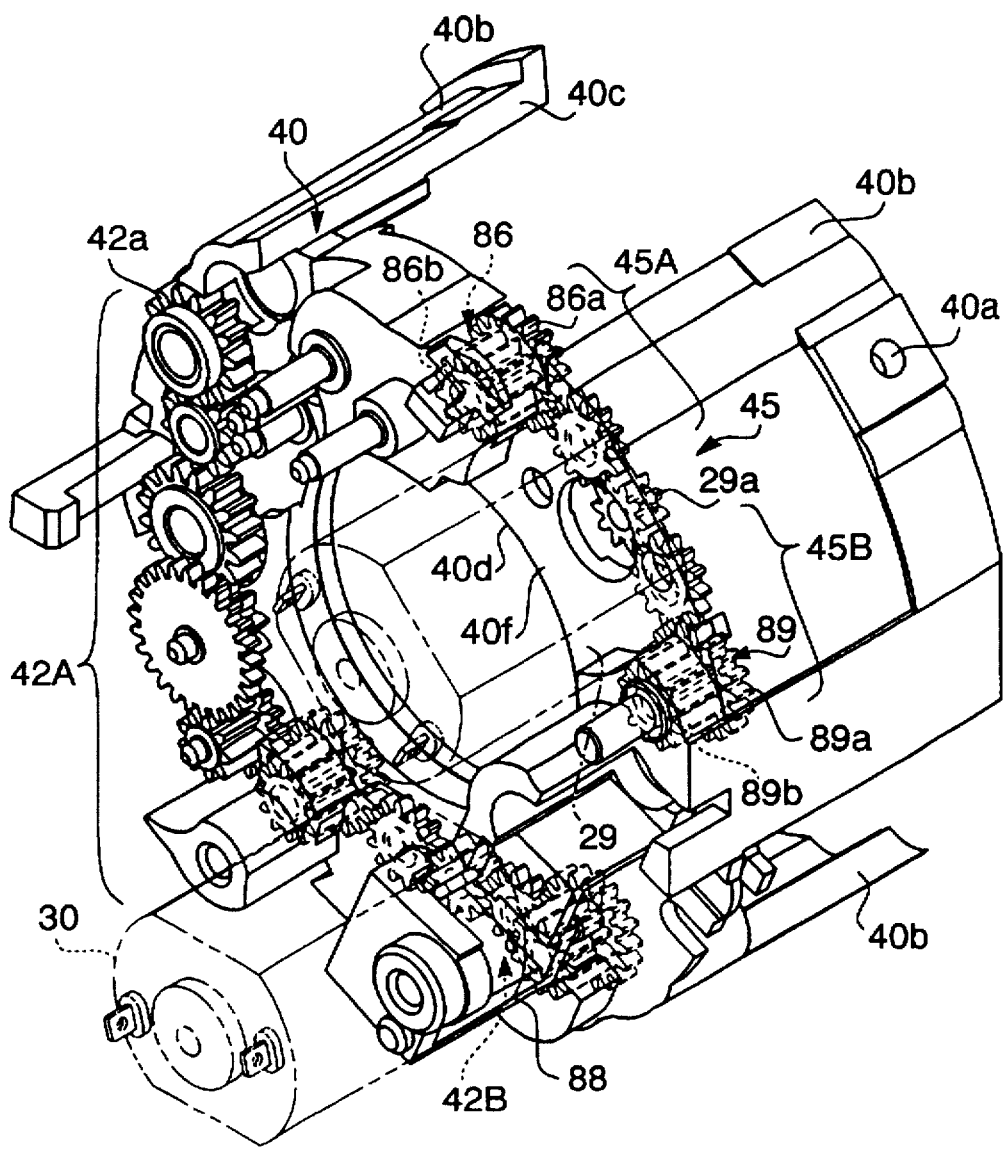
FIG. 16 is a perspective view showing the arrangement of the gear trains in the AF/AE shutter unit.

FIG. 16 shows the gear trains built in the shutter mounting stage 40. The rear lens group driving motor 30 is fixed to the lower part of the annular member 40f of the shutter mounting stage 40, and the lens driving gear train 42 is supported on the front wall of the annular member 40f. The lens driving gear train 42 includes a lens gear train 42A and an encoder gear train 42B. The lens gear train 42A transmits the rotation of the rear lens group driving motor 30 to the driving gear 42a that is engaged to the screw shaft 43. The endpoint of the screw shaft 43 is fixed to the lens supporting barrel 50, and the lens supporting barrel 50 is moved along the optical axis as the driving gear 42a rotates. The encoder gear train 42B transmits the rotation of the rear lens group driving motor 30 to the rotating disk 59 of the rear lens group encoder (see FIG. 5).

The AE motor 29 is fixed to the front wall of the annular member 40f. A pinion 29a is fixed to the rotating shaft of the AE motor 29 and protrudes towards the rear wall of the annular member 40f. Between the rear wall of the annular member 40f and the supporting member 47, a gear train 45, centered at pinion 29, is provided (the upper gear train in FIG. 15). The gear train 45 includes a shutter gear train 45A and an encoder gear train 45B. The shutter gear train 45A transmits the rotation of the AE motor 29 to the circular driving member 49 via the double gear 86. The encoder gear train 45B transmits the rotation of the AE motor 29 to the rotating disk 58 via a double gear 89.

Figure 17:
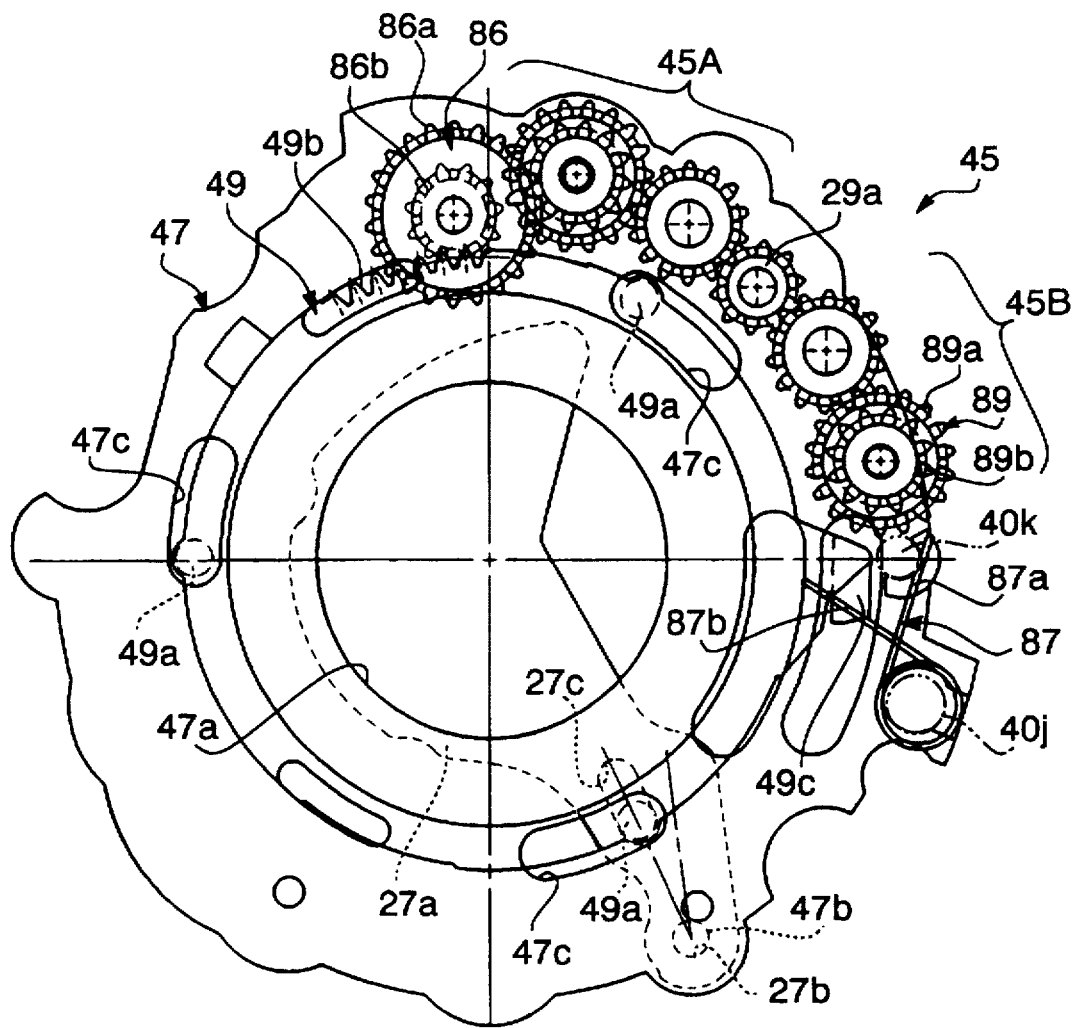
FIG. 17 is a front view showing the relationship between various parts of the AF/AE shutter unit in the fully closed condition of the shutter.
Figure 18:
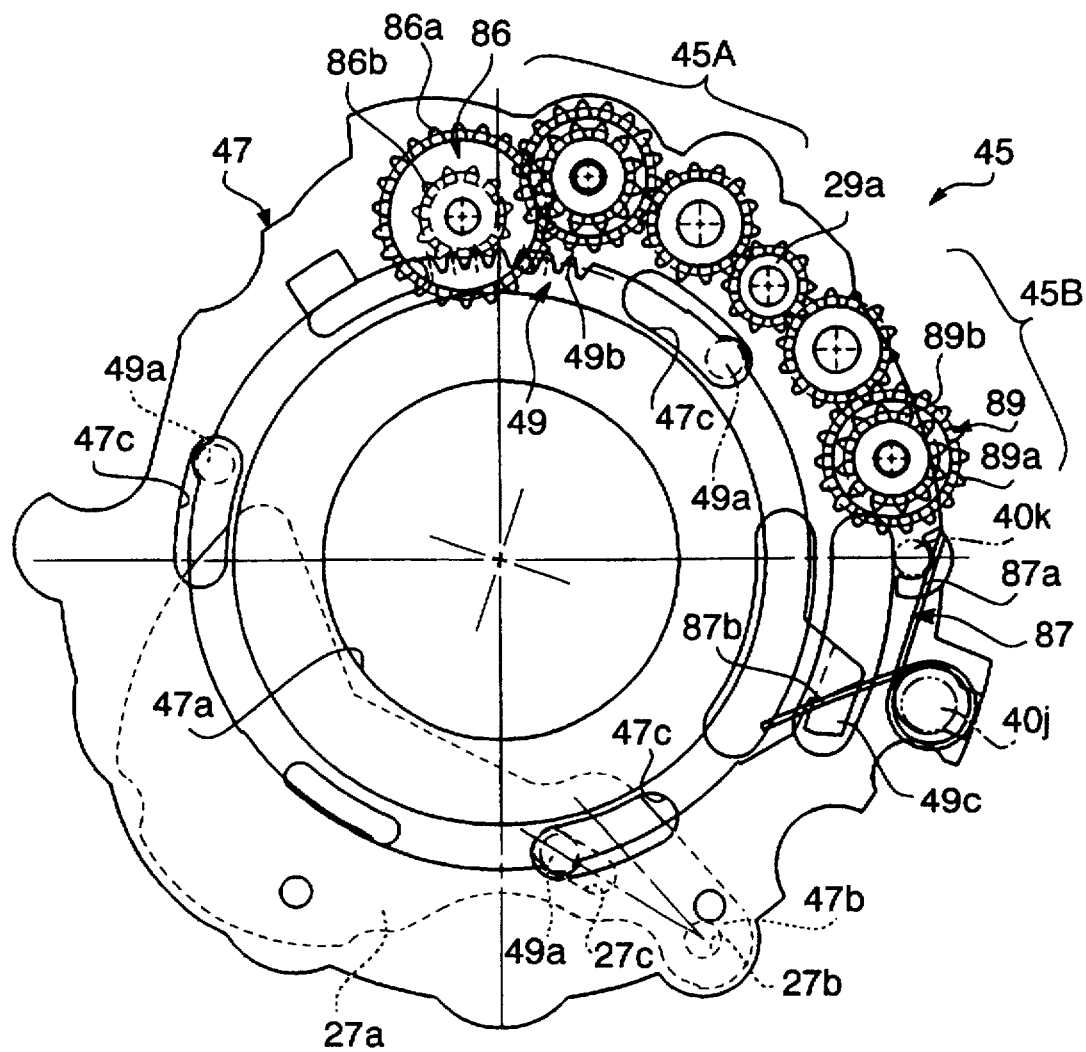
FIG. 18 is a front view showing the relationship between the various parts of the AF/AE shutter unit in the fully opened condition of the shutter.

FIGS. 17–18 show the connection between the shutter gear train 45A and the circular driving member 49. The double gear 86, which is the final gear of the AE gear train 45A, has a large-diameter gear 86a and a small-diameter gear 86b which are unified. The large-diameter gear 86a is engaged with the previous gear of the AE gear train 45A and the small-diameter gear 86b is engaged with the gear portion 49b of the circular driving member 49 as mentioned above.

The circular driving member 49 is loaded by a torsion spring 87 in the counterclockwise direction in FIG. 16. That is, the shutter 27 is urged closed. The torsion spring 87 is fitted to a spring supporting protrusion 40j provided on the rear wall of the annular member 40f. One arm 87a of the torsion spring 87 is engaged with a spring peg 40k, also provided on the rear wall of the annular member 40f. The other arm 87b is engaged with a spring hooking part 49c provided on the peripheral edge of the circular driving member 49. The torsion spring functions to reduce the backlash of the shutter gear train 45A.

FIG. 17 shows the condition where the shutter blade 27a is fully closed. As the AE motor 29 rotates to rotate the double gear 86 in the counterclockwise direction, the circular driving member 49 rotates in the clockwise direction against the load from the torsion spring 87 due to the connection of the small-diameter gear 86b and the gear portion 49b, and the shutter blades 27a are driven to open. FIG. 18 shows the condition where the shutter blade 27 is fully opened.

Figure 20:
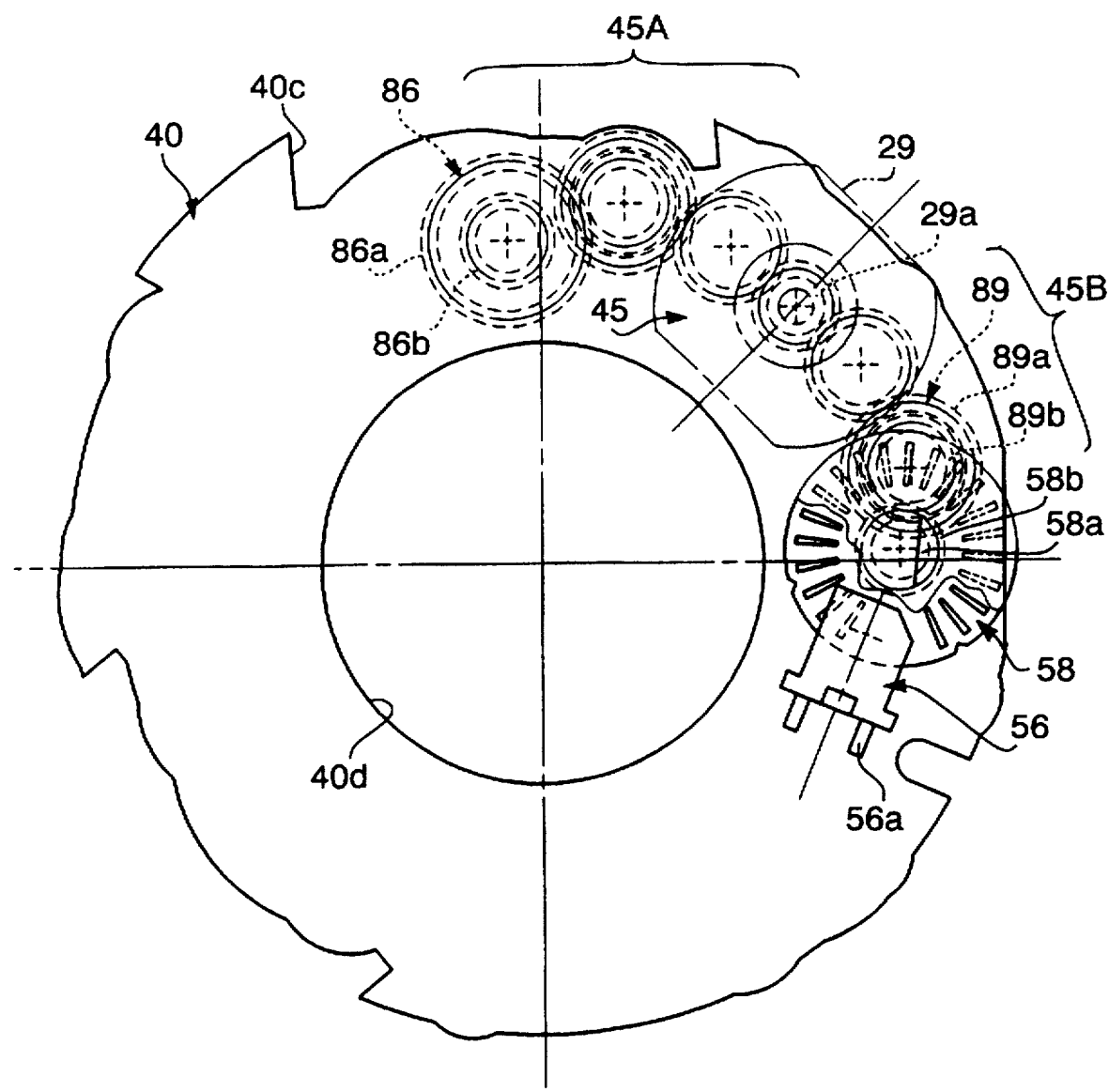
FIG. 20 is a front view showing the arrangement of the AE gear train, an AE motor and an AE motor encoder of a first embodiment.

The double gear 89, which is the final gear of the encoder gear train 45B, has a large-diameter gear 89a and a small-diameter gear 89b. The small-diameter gear 89b of the double gear 89 is engaged with the follower gear 58d of the rotating disk 58 as shown in FIG. 20. With such the connection, the rotating disk 58 rotates as the AE motor 29 rotates to drive the shutter blades 27a.

First embodiment

FIGS. 20 through 23 shows the encoder for the exposure controlling device according to the first embodiment.

An encoder comprises a photocoupler and a rotating disk positioned in connection with the photocoupler. The photocoupler includes a light emitting element such as a LED and a right receiving element such as a photodiode. The rotating disk of the invention is provided with a first angular range where the output signal from the photocoupler does not vary even when the rotating disk rotates and a second angular range where the output signal varies in cycles in accordance with the rotation of the rotating disk.

A light modulating pattern is applied to the second angular range. The light modulating pattern may be formed as a plurality of transparent parts arranged on the opaque surface or a plurality of light reflecting parts arranged on the low reflectivity surface. In case that the transparent parts are formed, a photointerrupter should be used as a photocoupler to detect the transmitted light through the transparent parts on the other hand, when the light reflecting parts are formed, a photoreflecter should be used to detect the reflected light from the light reflecting parts.

In the encoder 100 of this embodiment, the photointerrupter 56 is used as the photocoupler and the rotating disk 58 has radially-oriented slits S1-Sn that are angularly spaced. The rotating disk 58 rotates corresponding to the actuation of the shutter 27 by less than one full turn.

An initial position of an aperture diaphragm is defined as a stand-by position before an exposure and where the photocoupler faces to the first angular range of the rotating disk. When the aperture diaphragm is a lens shutter as in the embodiment, the initial position is a fully closed position. However, it may be a full open position in case of a camera having a shutter separate from a aperture diaphragm.

Figure 21:
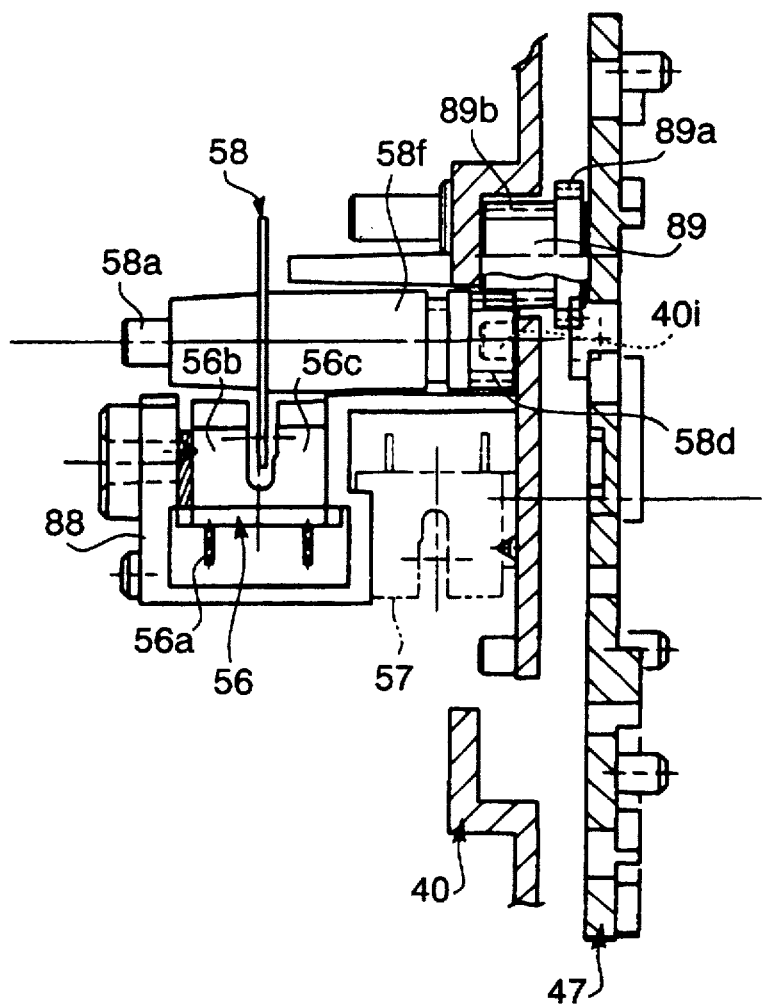
FIG. 21 is a sectional side view showing the arrangement of the AE motor encoder of the first embodiment.

As shown in FIG. 21, the photointerrupter 56 is fixed to the inner side of a housing part 88. The housing part 88 is formed integral to the annular member 40f of the shutter mounting stage 40 (see FIG. 5). The photointerrupter 56 includes terminals 56a, a light emitting part 56b and a light receiving part 56c. The parts 56b and 56c are positioned facing each other along the optical axis direction.

The rotating disk 58 is positioned in a gap 56d formed between the light emitting part 56b and the light receiving part 56c of the photointerrupter 56. The center of the rotating disk 58 is fixed to a rotating shaft 58f. A protrusion 58a extends from the end of the rotating shaft 58f and is rotatably supported in the holding member 53. A follower gear 58d is fixed to the other end of the rotating shaft 58f and is rotatably supported on a protrusion 40i provided on the shutter mounting stage 40.

Thus, when the AE motor 29 is driven to rotate, the shutter blades 27a are driven via the AE gear train 45A and the circular driving member 49. At the same time, the rotating disk 58 is driven via the encoder gear train 45B in synchronization with the driving of the shutter blades 27a.

Figure 22:
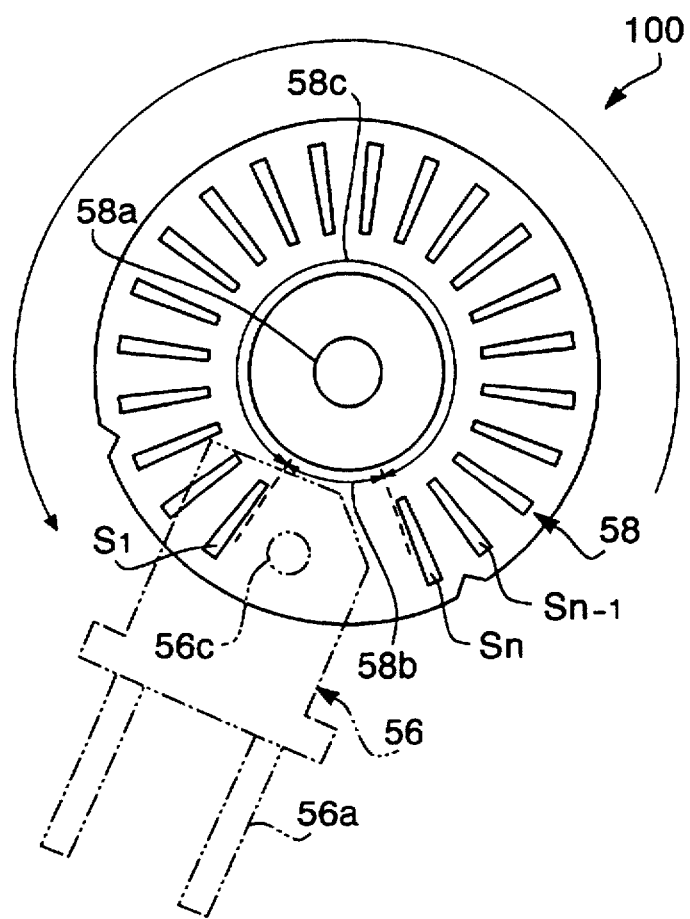
FIG. 22 is a front view of an AE motor encoder of the first embodiment.
Figure 23:
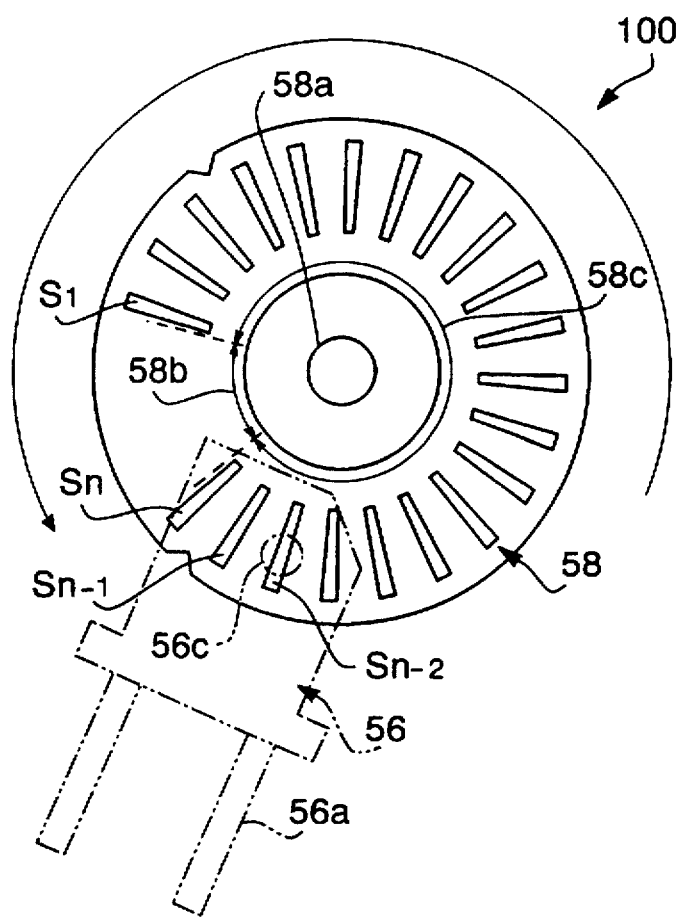
FIG. 23 is a front view of the AE motor encoder of the first embodiment in a different state from that shown in FIG. 22.

FIGS. 22 and 23 are enlarged diagram of the rotating disk 58 of the first embodiment. As mentioned above, the rotating disk 58 includes the first angular range 58b where no slits are formed, i.e. being opaque, and the second angular range 58c where a plurality of slits S1-Sn are formed radially and are positioned around the rotating disk 58 at equiangular intervals. When the light receiving part 56c of photointerrupter 56 faces to the first angular range 58b, the output signal from the photointerrupter 56 does not vary even when the rotating disk 58 rotates. When the light receiving part 56c faces to the second angular range 58c, the output signal from the photointerrupter 56 varies in cycles in accordance with the rotation of the rotating disk 58.

The rotating disk 58 is arranged such that the first angular range 58b is between the light emitting part 56b and the light receiving part 56c of the photointerrupter 56 when the shutter 27 is in the fully closed condition. Thus, the photointerrupter 56 generates an OFF signal when the shutter 27 is closed. Then, as the rotating disk 58 moves with respect to the photointerrupter 56 (i.e., as the shutter 27 opens from the fully closed condition) the slits S1-Sn of the second angular range 58c sequentially pass through the photointerrupter 56, and the photointerrupter 56 generates a signal that includes a series of ON pulses.

In particular, the rotating disk 58 rotates by less than one full turn between the fully closed and fully open conditions of the shutter 27. That is, the each of slits is related to the aperture diameter of the shutter 27 with one-to-one correspondence. With this arrangement, since the controlling unit can absolutely determine the aperture area of the shutter 27 by counting the pulses from the initial position.

In the first embodiment, the first angular range 58b of the rotating disk 58 is sufficiently large to account for backlash or the like, at the initial position, the output of the AE encoder always changes from HIGH to LOW as the first slit S1 of the rotating disk 58 moves past the light receiving part 56c of the photointerrupter 56.

The photointerrupter 56 transmits the signal via the flexible printed circuit board 6 to the AE motor controller 66 shown in FIG. 11. The AE motor controller 66 controls the AE motor 29 to drive the shutter blades 27 in accordance with signals received from the photointerrupter 56. The AE motor controller 66 is a part of a control unit 75 (see FIG. 8) mounted on the camera body. The control unit 75 includes, for example, a CPU (not shown), the AE motor controller 66, the whole optical unit driving motor controller 60, the rear lens group driving motor controller 61, the object distance measuring apparatus 64, and the photometering apparatus 65. Thef control unit 75 is also connected to, for example, the zoom operating device 62 and the focus operating device 63.

The exposure controlling device of the first embodiment comprises the motorized driving mechanism to open and close the shutter blades 27a, which includes the AE motor 29, the AE gear train 45A and the circular driving member 49, the AE encoder 100 and the AE motor controller 66.

The AE motor controller 66 is usually set the shutter blades 27a such that the rotating disk 58 is positioned at the initial position (FIG. 22), i.e., the shutter blades 27a are fully closed, the light emitted from the light emitting portion 56c of the photointerrupter 56 is blocked and generates a constant OFF signal and the output from the AE motor encoder 100 is HIGH (H). At the time of an exposure, AE motor controller 66 drives the AE motor 29 to open the shutter blades 27a and the rotating disk 58 rotates in the counterclockwise direction in FIG. 22. While the shutter 27 is driven in the opening direction the slits S1-Sn sequentially pass the light beam of the photointerrupter 56 and the photointerrupter 56 generates an ON signal for each slit S1-Sn. The output from the AE motor encoder 100 is LOW (L) as each slit S1-Sn passes. The AE motor controller 66 receives the signal from the AE motor encoder 100 and uses the signal to determine the rotation position of the rotating disk 58, that is, the aperture area of the shutter 27. The AE motor controller 66 switches the rotation of the AE motor 29 from the opening direction to the closing direction when the required aperture area, which is determined by a brightness data and a film speed, is achieved. The AE motor controller 66 stops to drive the AE motor 29 in the closing direction when the signals form the AE encoder 100 is HIGH during a predetermined period which is longer than the pulse period during the photointerrupter 56 faces to the second angular range 58c of the rotating disk 58.

With this arrangement, since the AE motor controller 66 can always initialize the counter for counting the pulses from the AE encoder 100 when the rotating disk 58 returns to the initial position where the photointerrupter 56 faces to the first angular range 58b, the AE motor controller 66 can start to count from the boundary of the first and second angular ranges. Therefore, the AE motor controller 66 can accurately detect the aperture diameter based on the count of the pulses. The step out can be canceled by initializing the counter at the initial position, and the affection of the backlash or the rebound does not rise because the signal count always starts under the condition where the rotating disk 58 rotates in the counterclockwise direction in FIG. 22.

Figure 24:
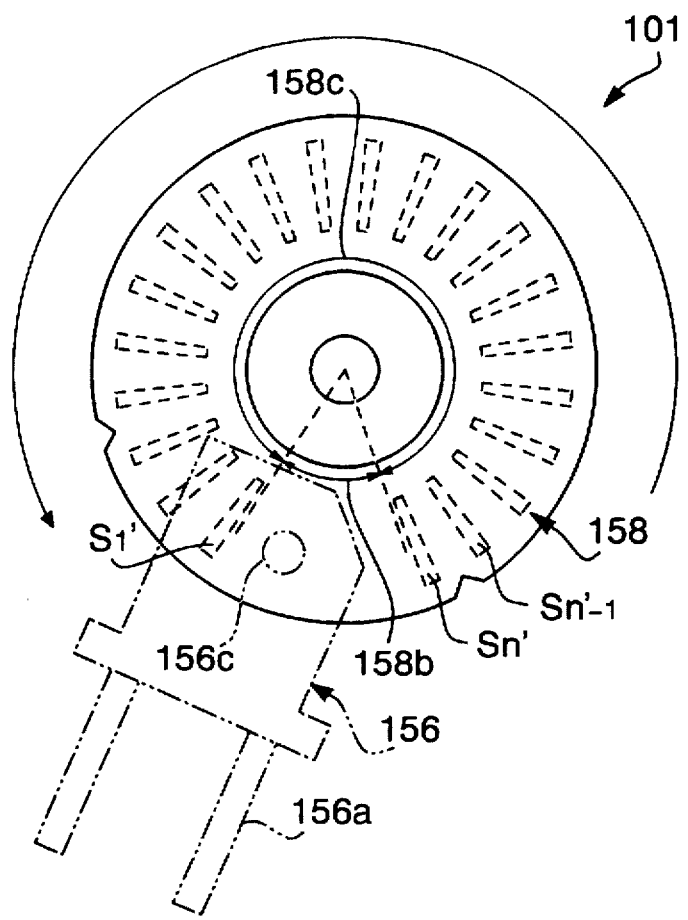
FIG. 24 is a front view showing an alternative AE motor encoder of the first embodiment.
Figure 25:
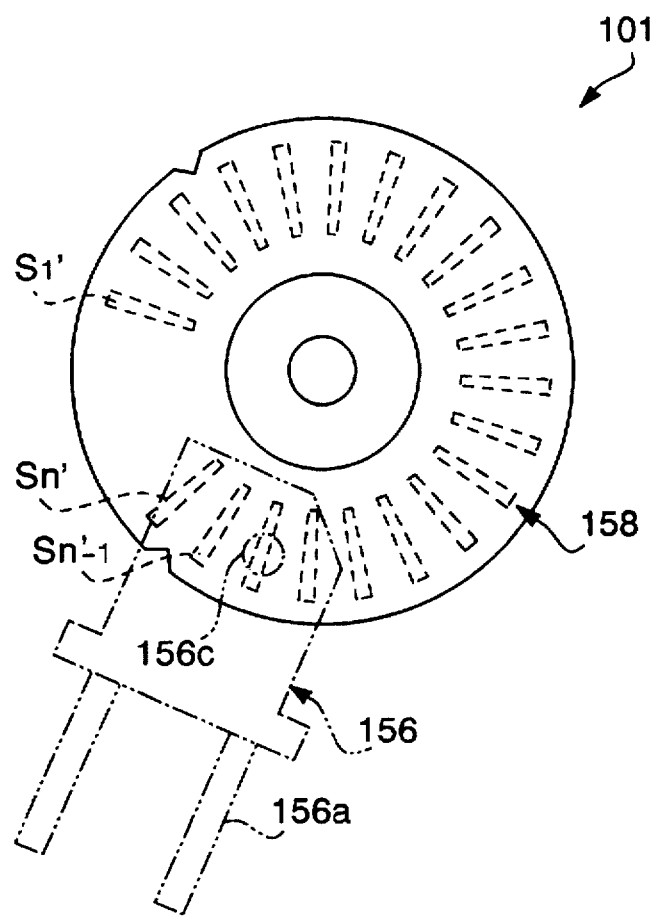
FIG. 25 is a front view of the AE motor encoder of FIG. 24 in a different state.

Although, in the first embodiment, the first angular range 58b of the rotating disk 58 is described as opaque and the second angular range 58c is described as including slits S1-Sn, the rotating disk 58 could alternatively be arranged as shown in FIGS. 24 and 25. In this alternative, an encoder 101 comprises a photoreflecter 156 that is used as the photocoupler in place of the photointerrupter 56 and a rotating disk 158. The rotating disk 158 is formed to have a low reflectivity surface and includes a first angular range 158b where no light modulating pattern is formed and a second angular range 158c where light modulating pattern is formed as a plurality of light reflecting parts S1'-Sn' arranged at equiangular intervals around the rotating disk 158. The light reflecting parts S1'-Sn' may be mirrors.

The photoreflecter 156 includes terminals 156a and a light receiving part 156c.

The output signal from the photoreflecter 156 is same as that of the photointerrupter 56 of the first embodiment.

When the rotating disk 158 is set at an initial position as shown in FIG. 24, the photoreflecter 156 generates an OFF signal. Then, as the rotating disk 158 moves with respect to the photoreflecter 156 (i.e., as the shutter 27 opens from the fully closed condition) the light reflecting parts S1'-Sn' of the second angular range 158c sequentially pass through the photoreflecter 156, and the photoreflecter 156 generates a signal that includes a series of ON pulses.

The relationship of reflectivities may also be inverted, such that the second angular range includes a plurality of low reflectivity parts disposed on the rotating disk and the first part is a high reflectivity part.

Second embodiment

Figure 26:
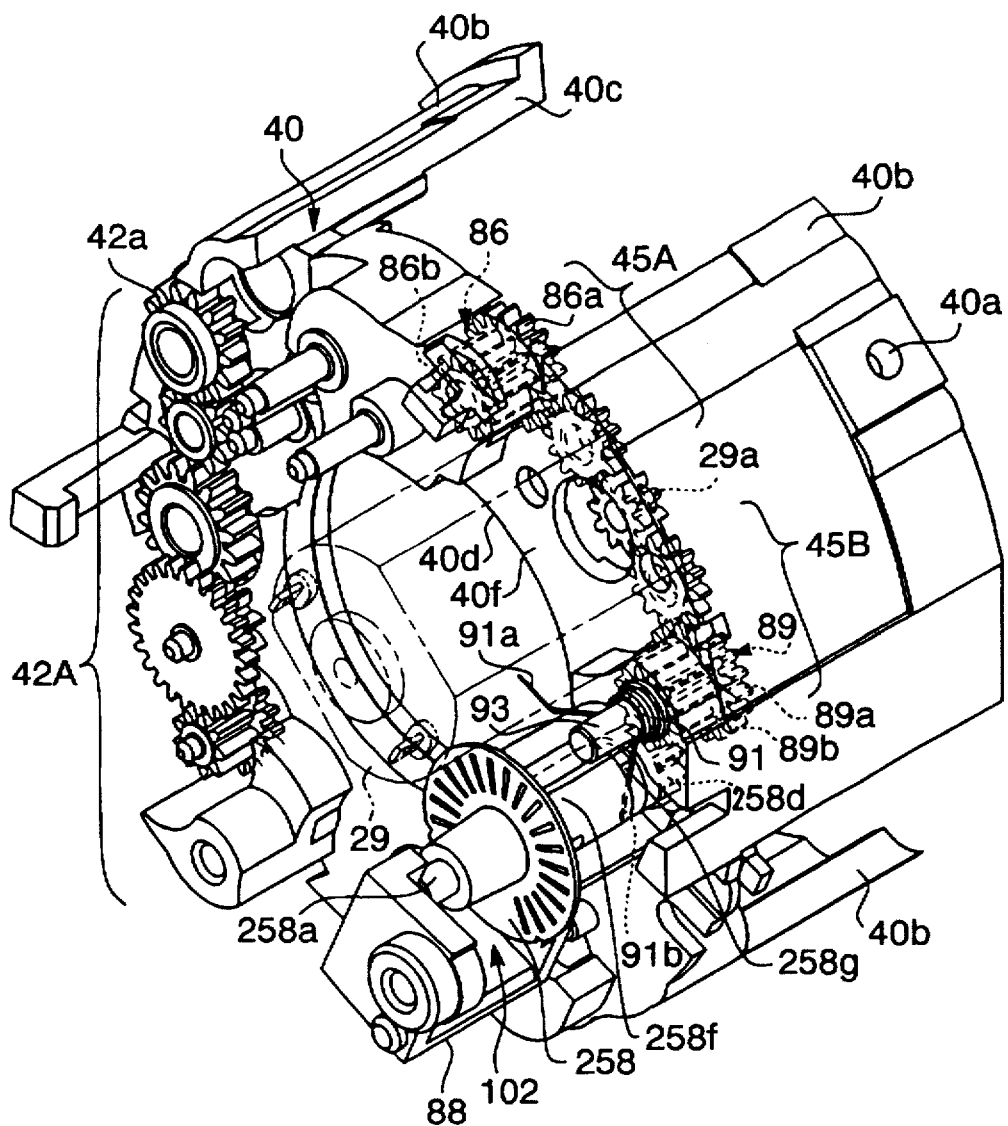
FIG. 26 is a perspective view which shows the arrangement of gear trains and an AE motor encoder of a second embodiment in the AF/AE shutter unit.

A second embodiment of an exposure controlling device shall now by described with reference to FIGS. 26–28. The exposure controlling device of the second embodiment includes all of the features of the first embodiment including a photointerrupter 256 and a rotating disk 258, and further includes a detent mechanism that positions the rotating disk 258 at the initial position. As in the first embodiment, the photointerrupter 256 is fixed to the lower side of the annular part 40f and the rotating disk 258 is rotatably supported above the photointerrupter 256 as shown in FIG. 28. The photointerrupter 256 includes terminals 256a, a light emitting part 256b and a light receiving part 256c. The rotating disk 258 is positioned in a gap 256d formed between the light emitting part 256b and the light receiving part 256c of the photointerrupter 256. The center of the rotating disk 258 is fixed to a rotating shaft 258f. A protrusion 258a extends from the end of the rotating shaft 258f and is rotatably supported in the holding member 53. The small-diameter gear 89b of the double gear 89 is engaged with a follower gear 258d of the rotating disk 258 as shown in FIG. 26.

The rotating disk 258 has a plurality of slits formed on an opaque surface as a light modulating pattern. The arrangement of the slits are identical to the first embodiment. The rotating disk 258 rotates corresponding to the actuation of the shutter 27 by less than one full turn.

In this embodiment, the detent mechanism comprises a flat surface portion 258g formed on the rotating shaft 258f of the rotating disk 258 and a spring loaded locking member that contacts with the rotating shaft 258f. The flat surface portion 258g is parallel to a rotation axis of the rotating shaft 258f and the shaft has a D-shaped cross-section including the flat surface portion 258g and a circular portion 258h as shown in FIG. 27. The spring loaded locking member comprises a torsion spring 91 that is provided on the spring supporting shaft 93 formed on the annular member 40f of the shutter supporting member 40. The torsion spring 91 has a first arm 91a hooked to a spring peg 92 formed on the shutter mounting stage 40 as a base portion and a second arm 91b being in resilient contact with the rotating shaft 258f.

Figure 27:
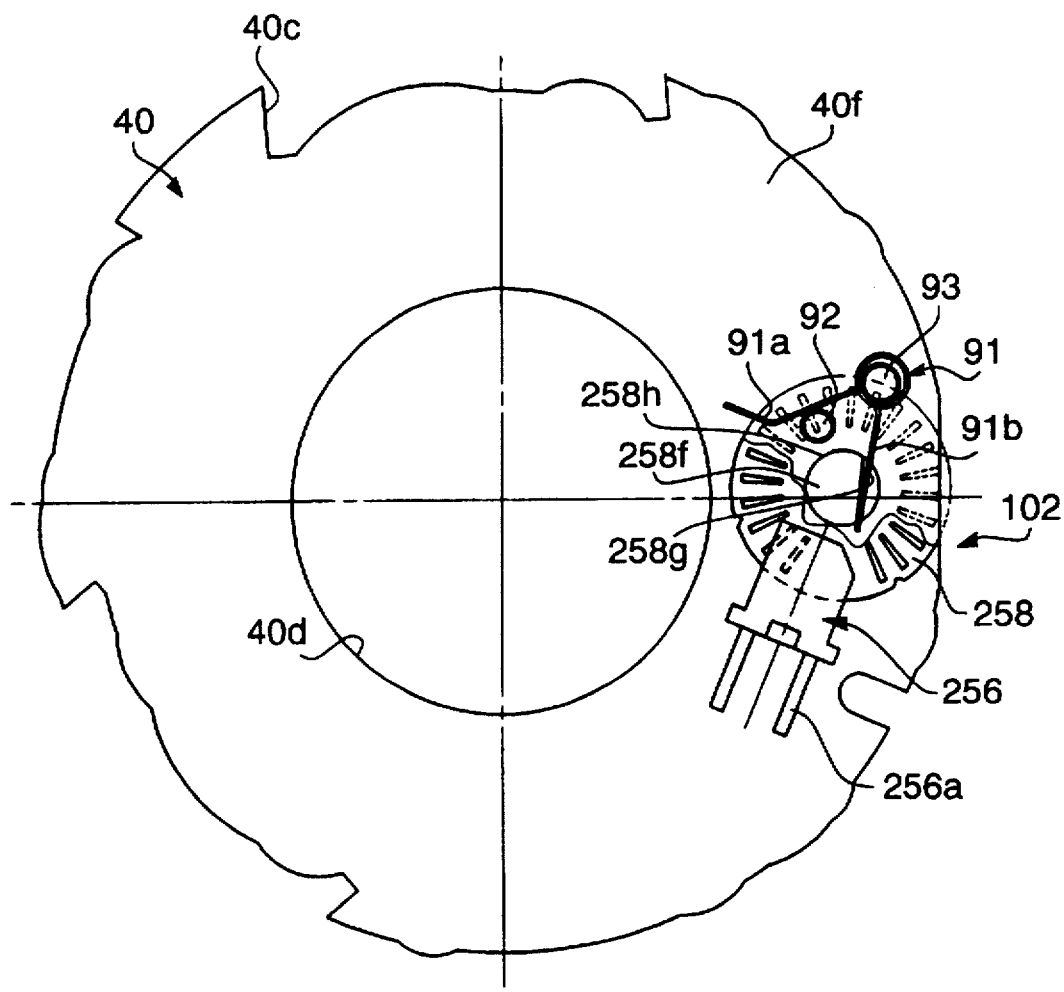
FIG. 27 is a front view showing the arrangement of the AE motor encoder of the second embodiment.
Figure 28:
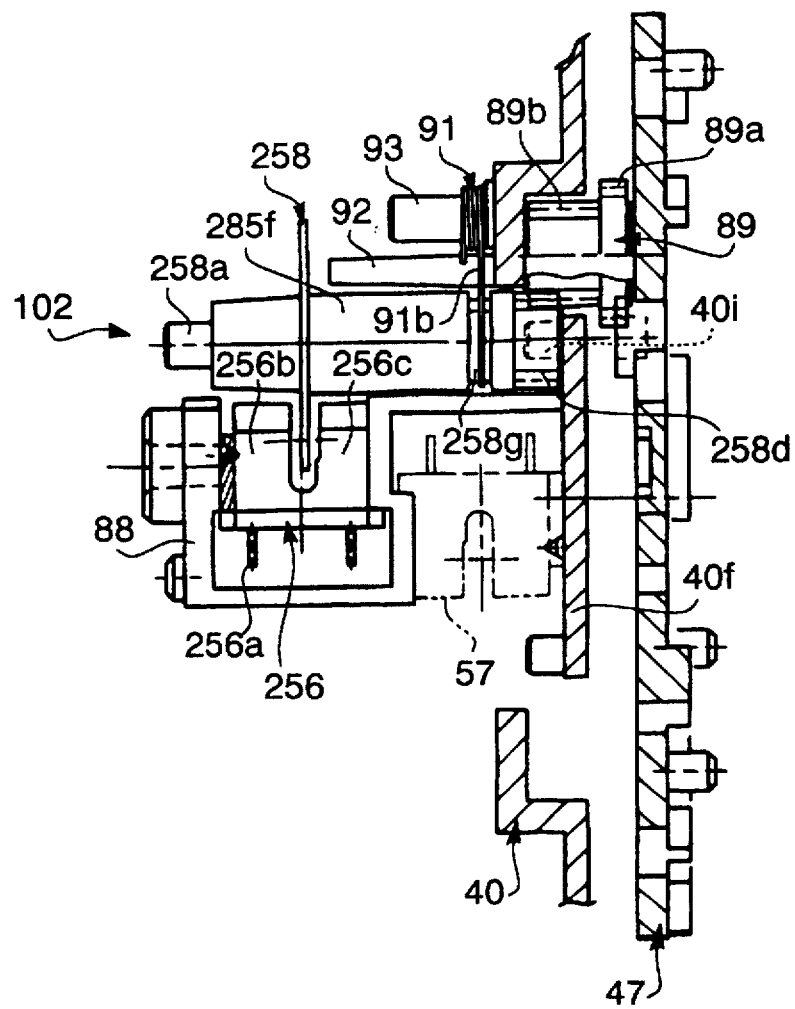
FIG. 28 is a sectional side view showing the arrangement of the AE motor encoder of the second embodiment.

Referring to FIGS. 27 and 28, the second arm 91b of the torsion spring 91 contacts with the flat surface portion 258g when the rotating disk 258 is positioned at the initial position and the torsion spring 91 holds the rotating shaft 258f at the initial position.

Thus, when the shutter 27 is in the fully closed condition, the second arm 91b is in resilient contact with the flat surface portion 258g, and, as the shutter 27 opens, the second arm 91b comes into resilient contact with the circular part 258h. In other words, the second arm 91b is in resilient contact along the flat face of flat surface portion 258g when the rotating disk 58 has returned to the initial position.

When the rotating disk 58 returns to the initial position after operation, it may not return fully to the precise initial position due to backlash, rebound, or the like. However, since the second arm 91b presses against the flat surface portion 58g, the torsion spring 91 operates such that, even if the rotating disk 258 does not return precisely to the initial position, the rotating disk 258 will be urged to enter a state such that the second arm 91b of the torsion spring 91 will be flat along the flat surface portion 258g, and thus, the rotating disk 258 will be returned precisely to the initial position.

For example, in the condition shown in FIG. 27, the lower end of the second arm 91b presses the lower part of the flat surface portion 258g and thereby rotationally urges the rotating disk 258 in the clockwise direction, such that the rotating shaft 258f will be forcibly returned to the condition where the second arm 91b is flat along the flat surface portion 258g and the rotating disk 58 is precisely at the initial position.

In the second embodiment, since the initial position of the rotating disk 258 is consistent, the shutter can be controlled in an extremely stable manner.

As with the first embodiment, the rotating disk 258 and the photointerrupter 256 could alternatively be configured as shown in FIGS. 24 and 25 and as described above.

Third embodiment

An encoder of an exposure controlling device according to a third embodiment shall now be described with reference to FIGS. 29–30. The encoder 103 of the third embodiment is similar to that of the second embodiment except an intervals of slits formed on a rotating disk 358.

Figure 29:
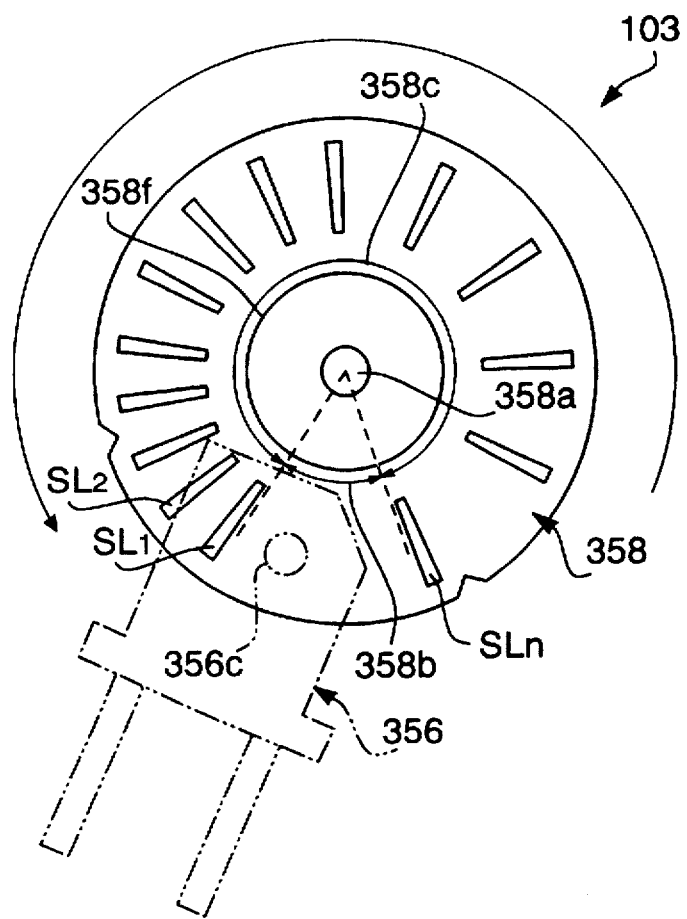
FIG. 29 is a front view of an AE motor encoder of the third embodiment.
Figure 30:
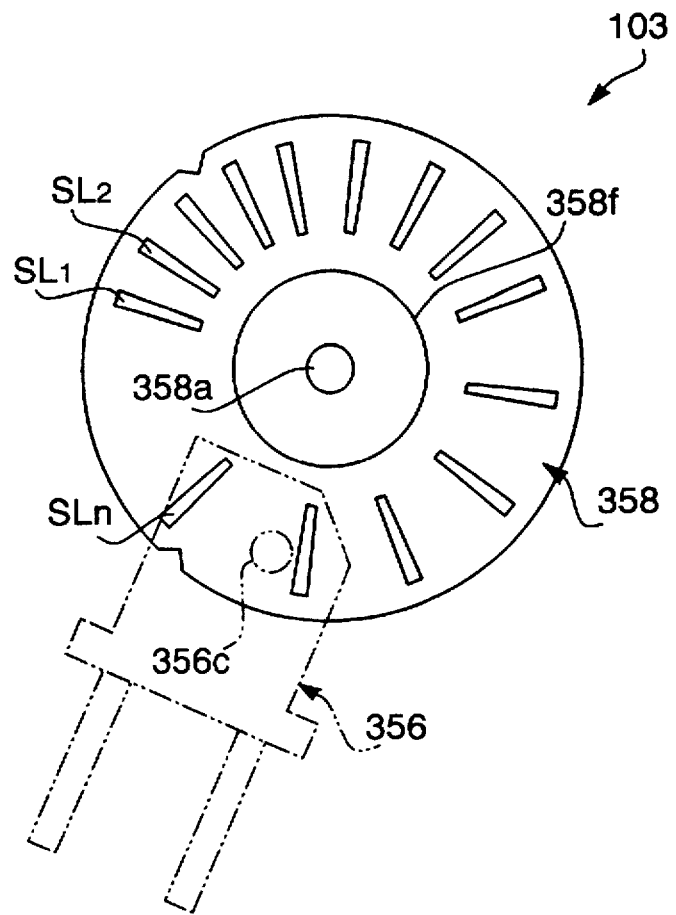
FIG. 30 is a front view of the AE motor encoder of the third embodiment in a different state from that shown in FIG. 29.

As shown in FIGS. 29 and 30, the photointerrupter 356 includes a light emitting part (not shown) and a light receiving part 356c. The rotating disk 358 is positioned between the light emitting part and the light receiving part 356c of the photointerrupter 356. The center of the rotating disk 358 is fixed to a rotating shaft 358f. A protrusion 358a extends from the end of the rotating shaft 358f and is rotatably supported in the holding member 53. The rotating disk 358 rotates corresponding to the actuation of the shutter 27 by less than one full turn.

The encoder 103 may also include the detent mechanism that comprises the torsion spring 91 to hold the rotating shaft 358f at the initial position when a second arm 91b of the torsion spring 91 contacts with a flat surface portion 358g formed on the rotating shaft 358f as the same manner as the second embodiment.

The rotating disk 358 includes a first angular range 358b where no slits are formed, i.e. being opaque, and a second angular range 358c where a plurality of slits S1-Sn are formed radially and are positioned around the rotating disk 358. The light modulating pattern of the third embodiment is formed as a plurality of radially-oriented slits S1-Sn arranged on the opaque surface of the rotating disk 358 as shown in FIGS. 29 and 30.

The intervals of the slits are determined so that the output level of signals from the photointerrupter 356 varies in variable cycles with rotating the rotating disk 358. The cycles of change of the output signals gradually increases as the aperture area of the shutter increases. In the other words, the slits S1-Sn are formed in variable angular intervals. And the angular interval of the slits increases from the first slit S1 toward the last slit Sn.

At the initial position (FIG. 29), i.e., the shutter blades 27a are fully closed, the light emitted from the light emitting portion 356c of the photointerrupter 356 is blocked and generates a constant OFF signal and the output from the AE motor encoder 103 is HIGH (H). At the time of an exposure, the AE motor 29 is driven to open the shutter blades 27a and the rotating disk 58 rotates in the counterclockwise direction in FIG. 29. While the shutter 27 is driven in the opening direction, the slits sequentially pass the light beam of the photointerrupter 356 and the photointerrupter 356 generates an ON signal for each slit. The output from the AE motor encoder 103 is LOW (L) as each slit passes. The rotation position of the rotating disk 358, that is, the aperture area of the shutter 27 can be determined by detecting the signals from the AE motor encoder 103.

Figure 31:
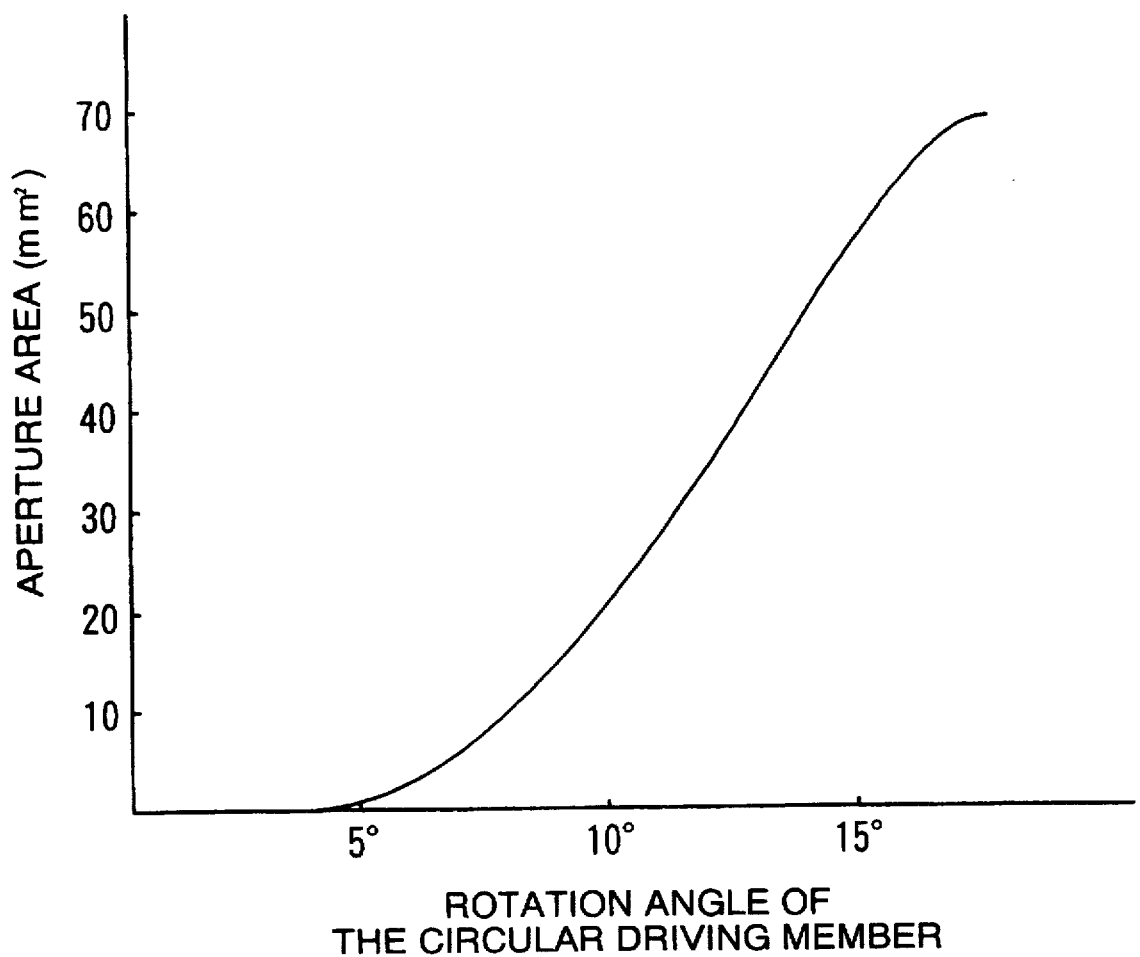
FIG. 31 is a graph showing the correlation between the rotation angle of a circular driving member and a shutter aperture area.

The shutter blades 27a are driven by the AE motor 29 via the gear train 45A and the circular driving member 49 as described in the first embodiment. The correlation between the rotation angle of the circular driving member 49 from the initial position, which is proportioned to the rotation amount of the AE motor 29, and the aperture area of the shutter 27 is nonlinear as shown in FIG. 31. The aperture area is equivalent to an aperture value Av that determines the exposure value Ev with a time value Tv (Ev=Av+Tv).

Figure 32:
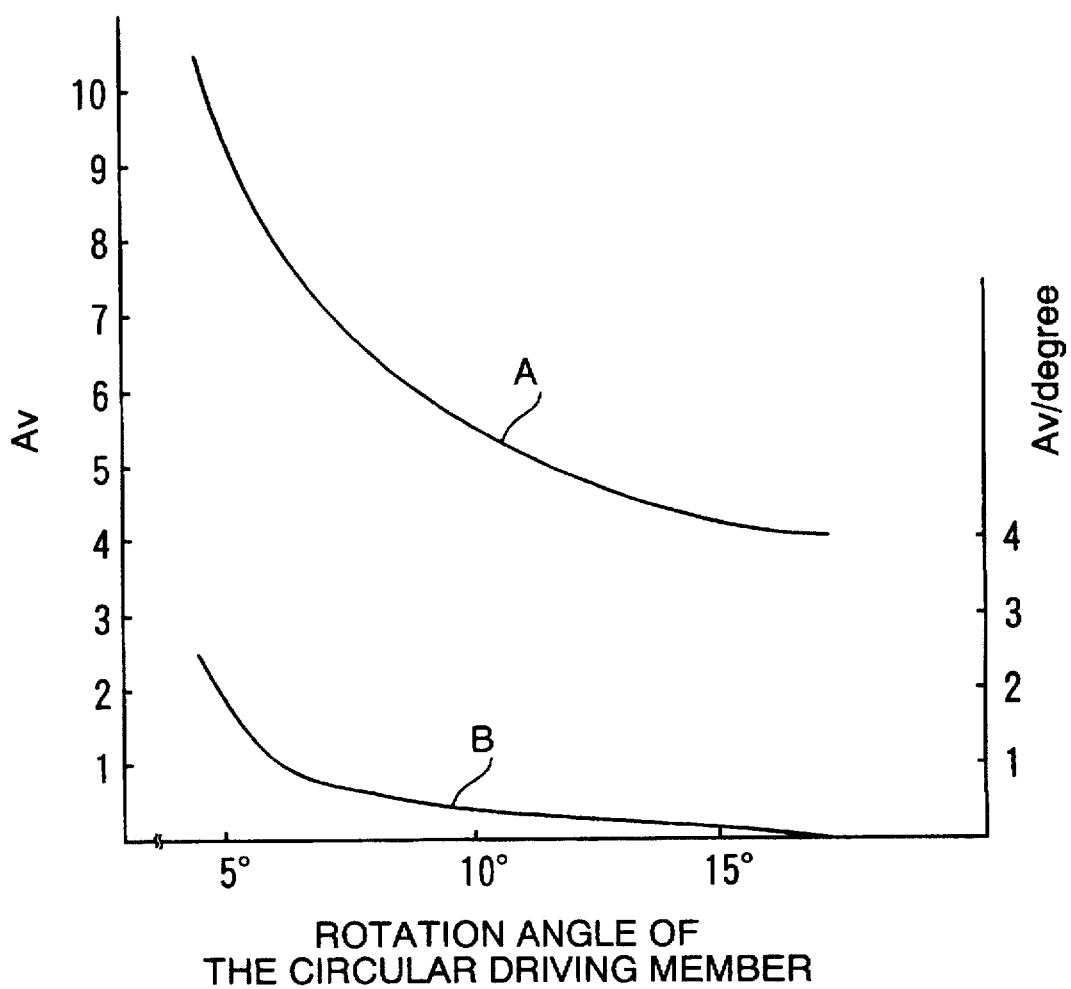
FIG. 32 is a graph showing the correlation between the rotation angle of the circular driving member and the Av value, and showing the correlation between the rotation angle of the circular driving member and the ratio of change of the Av value.

A curve A in a graph of FIG. 32 indicates the correlation between the rotation angle of the circular driving member 49 and the aperture value Av and a curve B indicates a ratio of change of the aperture value Av with respect to an angular change of the circular driving member 49 by 1 degree. In FIG. 32, the left vertical axis shows a unit for the curve A (Av) and the right vertical axis shows a unit for the curve B (Av/degree). For example, the value pointed by the curve B at the angle of 10 degrees is calculated by subtracting the aperture value at the angle of 10.5 degrees from the aperture value at the angle of 9.5 degrees.

The curve B in the graph in FIG. 32 indicates that the ratio of change of the aperture value Av of the shutter 27 with respect to the rotation angle of the circular driving member 49 is relatively large near the initial position where the rotation angle is small such as 5 degrees. And the ratio is relatively small near the fully opened position where the rotation angle is beyond 10 degrees. Thus, the precision of exposure control must be higher for smaller apertures where the ratio of change of the aperture value Av is large, and the precision of exposure control can be lower for apertures near the open aperture range where the ratio of change of the Av value is small.

In case that the slits are formed in constant intervals as, the first and second embodiment, the interval must be determined such that it is sufficient for the exposure control at small aperture. That is, the accuracy of the encoder will be too precise for at larger aperture as compared with the required precision of the exposure control.

In the third embodiment, the intervals of the slits are determined with considering the above-mentioned required precision, and thus, the smaller the aperture area is, the smaller the interval is, i.e., the higher the resolution is. Particularly, the intervals are set so that the number of pulses counted from the initial position is proportioned to the aperture area of the shutter 27. That is, the angular intervals of the slits are designed so that the number of the pulses from the photointerrupter 356 counted from the initial position is proportioned to the aperture area of the shutter 27. With this arrangement, the correlation between the number of the pulses and the aperture area is linear and thus the control is easier than the first embodiment.

Figure 33:
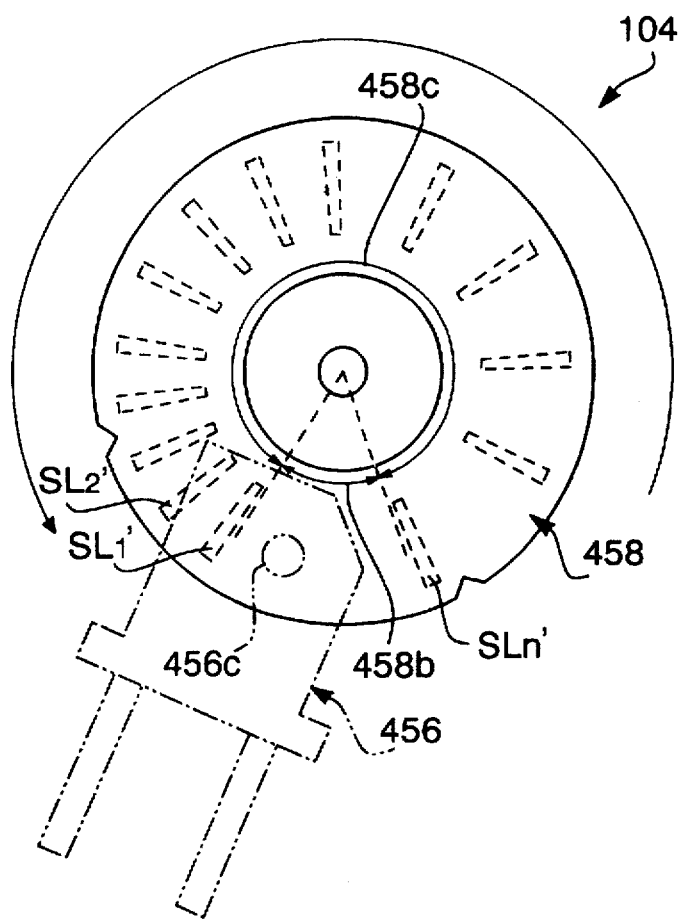
FIG. 33 is a front view showing an alternative AE motor encoder of the third embodiment.
Figure 34:
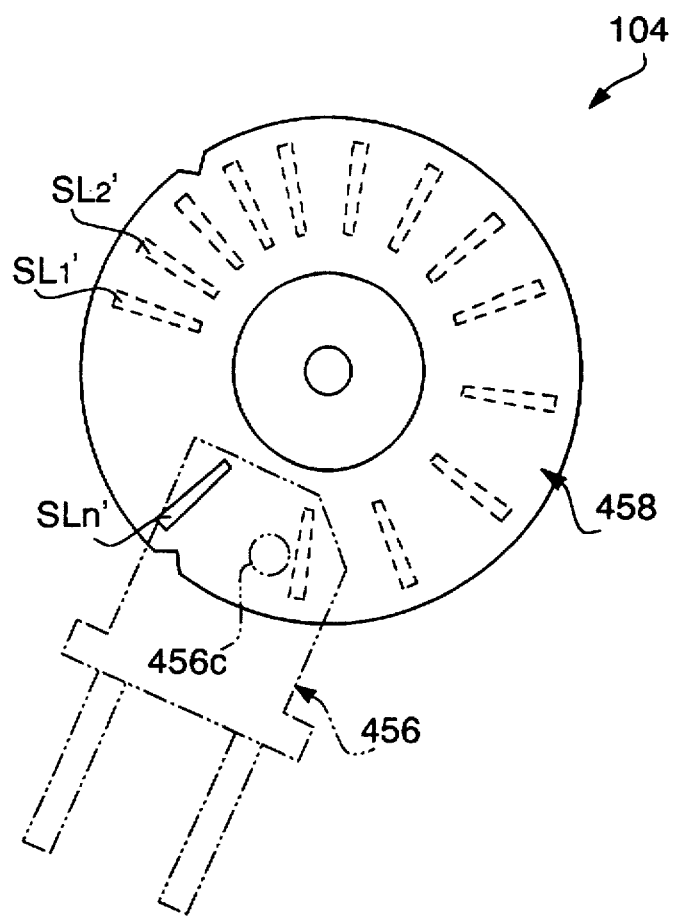
FIG. 34 is a front view of the AE motor encoder of FIG. 35 in a different state.

FIGS. 33 and 34, show an alternative arrangement of the encoder of the third embodiment. In this alternative, an encoder 104 comprises a photoreflecter 456 that is used as the photocoupler in place of the photointerrupter 456 and a rotating disk 458. The photoreflecter 456 includes a light emitting part (not shown) and a light receiving part 456c to detect the light reflected from the rotating disk 458. The rotating disk 458 is formed to have a low reflectivity surface and includes a first angular range 458b where no light modulating pattern is formed and a second angular range 458c where light modulating pattern is formed as a plurality of light reflecting parts S1'-Sn' arranged at the same manner as the slits of the third embodiment.

The output signal from the photoreflecter 456 is same as that of the photointerrupter 356 of the first embodiment. When the rotating disk 158 is set at an initial position as shown in FIG. 33, the photoreflecter 456 generates an OFF signal. Then, as the rotating disk 458 moves with respect to the photoreflecter 456 (i.e., as the shutter 27 opens from the fully closed condition) the light reflecting parts S1'-Sn' of the second angular range 458c sequentially pass through the photoreflecter 456, and the photoreflecter 456 generates a signal that includes a series of ON pulses.

The relationship of reflectivities may also be inverted, such that the second angular range includes a plurality of low reflectivity parts disposed on the rotating disk and the first part is a high reflectivity part.

The present disclosure relates to subject matter contained in Japanese Patent Application Nos. HEI 08-027135, filed on Feb. 14, 1996, HEI 08-029488, filed on Feb. 16, 1996, HEI 08-057879, filed on Mar. 14, 1996 and HEI 08-012317 filed on Jan. 26, 1996 which are expressly incorporated herein by reference in their entirety.

What is claimed is:

1. An exposure controlling device of a camera having an aperture diaphragm, said exposure controlling device comprising:
   a motorized driving mechanism to open and close said aperture diaphragm;
   an encoder for detecting an actuation of said motorized driving mechanism, said encoder comprising:
   a sensor; and
   a rotating disk mounted in connection with said sensor, said rotating disk rotating by less than one revolution in correspondence with the actuation of said motorized driving mechanism, wherein said rotating disk has a first angular range in which an output signal from said sensor does not vary as said rotating disk rotates and a second angular range in which the output signal from said sensor varies in accordance with the rotation of said rotating disk, and
   wherein said sensor faces said first angular range when said aperture diaphragm is set at a predetermined initial position;
   a detent mechanism that positions said rotating disk at said initial position; and
   a controlling unit that controls said motorized driving mechanism to drive said aperture diaphragm in accordance with signals received from said sensor.

2. The exposure controlling device according to claim 1, wherein said aperture diaphragm comprises a lens shutter having shutter blades that function as an aperture diaphragm and a shutter.

3. The exposure controlling device according to claim 2, wherein said shutter blades are fully closed at said initial position.

4. The exposure controlling device according to claim 3, wherein said controlling unit controls, at the time of an exposure, said motorized driving mechanism to open said shutter blades and then to close said shutter blades.

5. The exposure controlling device according to claim 1, wherein said controlling unit determines an aperture area of said aperture diaphragm based on signals output from said sensor.

6. The exposure controlling device according to claim 1, wherein said detent mechanism comprises a flat surface portion formed on a rotating shaft of said rotating disk such that said flat surface portion is parallel to a rotation axis of said rotating shaft, and a spring loaded locking member that contacts with said rotating shaft, and wherein said locking member contacts with said flat surface portion when said rotating disk is positioned at said initial position.

7. The exposure controlling device according to claim 6, wherein said locking member comprises a torsion spring that has a first arm fixed to a base portion and a second arm being in resilient contact with said rotating shaft.

8. An exposure controlling device of a camera having an aperture diaphragm, said exposure controlling device comprising:
   a motorized driving mechanism to open and close said aperture diaphragm;
   an encoder for detecting an actuation of said motorized driving mechanism, said encoder comprising:
      a sensor; and
      a rotating disk mounted in connection with said sensor, said rotating disk rotating by less than one revolution in correspondence with the actuation of said motorized driving mechanism, wherein said rotating disk has a first angular range in which an output signal from said sensor does not vary as said rotating disk rotates and a second angular range in which the output signal from said sensor varies in accordance with the rotation of said rotating disk, wherein said sensor faces said first angular range when said aperture diaphragm is set at a predetermined initial position;
      said second angular range is provided with a pattern that changes the output level of the signals from said sensor in constant cycles in accordance with rotation of said rotating disk;
   wherein said sensor comprises a photocoupler and said pattern comprises a light modulating pattern;
   said light modulating pattern is formed as a plurality of light reflecting parts arranged on a low reflectivity surface of said rotating disk, wherein said photocoupler comprises a photoreflecter to detect the reflected light from said light reflecting parts; and
   a controlling unit that controls said motorized driving mechanism to drive said aperture diaphragm in accordance with signals received from said sensor.

9. The exposure controlling device according to claim 8, wherein said light modulating pattern is formed as a plurality of transparent parts arranged on an opaque surface of said rotating disk, and wherein said photocoupler comprises a photointerrupter to detect the transmitted light through said transparent parts.

10. The exposure controlling device according to claim 9, wherein said light transmitting parts are formed as angularly spaced radially-oriented slits.

11. The exposure controlling device according to claim 9, wherein said first angular range is formed as an opaque region.

12. The exposure controlling device according to claim 8, wherein said first angular range is formed as a low reflectivity region.

13. The exposure controlling device according to claim 8, wherein said first angular range is greater than an angular range corresponding to the output level of one of said constant cycles.

14. An exposure controlling device of a camera having an aperture diaphragm, said exposure controlling device comprising:
   a motorized driving mechanism to open and close said aperture diaphragm;
   an encoder for detecting an actuation of said motorized driving mechanism, said encoder comprising:
      a sensor; and
      a rotating disk mounted in connection with said sensor, said rotating disk rotating by less than one revolution in correspondence with the actuation of said motorized driving mechanism, wherein said rotating disk has a first angular range in which an output signal from said sensor does not vary as said rotating disk rotates and a second angular range in which the output signal from said sensor varies in accordance with the rotation of said rotating disk, and
      wherein said second angular range is provided with a pattern that changes the output level of signals from said sensor at variable intervals in accordance with rotation of said rotating disk, and said variable intervals of change gradually increase as the aperture area of said aperture diaphragm increases;
      wherein said sensor faces said first angular range when said aperture diaphragm is set at a predetermined initial position; and
   a controlling unit that controls said motorized driving mechanism to drive said aperture diaphragm in accordance with signals received from said sensor.

15. The exposure controlling device according to claim 14, wherein said sensor comprises a photocoupler and said pattern comprises a light modulating pattern.

16. The exposure controlling device according to claim 15, wherein said light modulating pattern is formed as a plurality of transparent parts arranged on an opaque surface of said rotating disk, and wherein said photocoupler comprises a photointerrupter to detect the transmitted light through said transparent parts.

17. The exposure controlling device according to claim 16, wherein said light transmitting parts are formed as angularly spaced radially-oriented slits.

18. The exposure controlling device according to claim 16, wherein said first angular range is formed as an opaque region.

19. The exposure controlling device according to claim 15, wherein said light modulating pattern is formed as a plurality of light reflecting parts arranged on a low reflectivity surface of said rotating disk, and wherein said photocoupler comprises a photoreflecter to detect the reflected light from said light reflecting parts.

20. The exposure controlling device according to claim 19, wherein said first angular range is formed as a low reflectivity region.

21. The exposure controlling device according to claim 15, wherein said light modulating pattern is determined such that the number of said intervals counted from said initial position is proportional to the aperture area of said aperture diaphragm.

22. The exposure controlling device according to claim 14, further comprising a detent mechanism that positions said rotating disk at said initial position.

23. The exposure controlling device according to claim 22, wherein said detent mechanism comprises a flat surface portion formed on a rotating shaft of said rotating disk such that said flat surface portion is parallel to a rotation axis of said rotating shaft, and a spring loaded locking member that contacts with said rotating shaft, and wherein said locking member contacts with said flat surface portion when said rotating disk is positioned at said initial position.

24. The exposure controlling device according to claim 23, wherein said locking member comprises a torsion spring that has a first arm fixed to a base portion and a second arm in resilient contact with said rotating shaft.

25. An encoder for a camera that detects an aperture area of an aperture diaphragm, said encoder comprising:
   a sensor; and
   a rotating disk mounted in connection with said sensor, said rotating disk rotating by less than one revolution in correspondence with the actuation of said aperture diaphragm, said rotating disk having a first angular range where an output signal from said sensor does not vary as said rotating disk rotates and a second angular range where the output signal from said sensor varies in cycles in accordance with the rotation of said rotating disk;
   wherein said sensor faces said first angular range when said aperture diaphragm is set at a predetermined initial position, and
   a detent mechanism that positions said rotating disk at said initial position.

26. The encoder according to claim 25, wherein said detent mechanism comprises a flat surface portion formed on a rotating shaft of said rotating disk such that said flat surface portion is parallel to a rotation axis of said rotating shaft, and a spring loaded locking member that contacts said rotating shaft and contacts said flat surface portion when said rotating disk is positioned at said initial position.

27. The encoder according to claim 26, wherein said locking member comprises a torsion spring that has a first arm fixed to a base portion and a second arm in resilient contact with said rotating shaft.

28. An encoder for a camera that detects an aperture area of an aperture diaphragm, said encoder comprising:
   a sensor; and
   a rotating disk mounted in connection with said sensor, said rotating disk rotating by less than one revolution in correspondence with the actuation of said aperture diaphragm, said rotating disk having a first angular range where an output signal from said sensor does not vary as said rotating disk rotates and a second angular range where the output signal from said sensor varies in cycles in accordance with the rotation of said rotating disk;
   wherein said sensor faces said first angular range when said aperture diaphragm is set at a predetermined initial position, said sensor comprises a photocoupler and said second angular range is provided with a light modulating pattern that changes the output level of signals from said photocoupler,
   wherein said light modulating pattern is formed as a plurality of transparent parts arranged on an opaque surface of said rotating disk, and wherein said photocoupler comprises a photointerrupter to detect the transmitted light through said transparent parts, and said transparent parts are formed at variable angular intervals; and
   wherein said variable angular intervals of said transparent parts gradually increase as the aperture area of said aperture diaphragm increases.

29. The encoder according to claim 28, wherein said light transmitting parts are formed as angularly spaced radially-oriented slits.

30. The encoder according to claim 28, wherein said first angular range is formed as an opaque region.

31. The encoder according to claim 28, wherein said transparent parts are formed at constant angular intervals.

32. The exposure controlling device according to claim 28, wherein the angular intervals of said light transparent parts are such that the number of the pulses from said photointerrupter counted from said initial position are proportional to the aperture area of said aperture diaphragm.

33. An encoder for a camera that detects an aperture area of an aperture diaphragm, said encoder comprising:
   a sensor; and
   a rotating disk mounted in connection with said sensor, said rotating disk rotating by less than one revolution in correspondence with the actuation of said aperture diaphragm, said rotating disk having a first angular range where an output signal from said sensor does not vary as said rotating disk rotates and a second angular range where the output signal from said sensor varies in cycles in accordance with the rotation of said rotating disk;
   said sensor comprises a photocoupler and said second angular range is provided with a light modulating pattern that changes the output level of the signals from said photocoupler;
   wherein said sensor faces said first angular range when said aperture diaphragm is set at a predetermined initial position; and
   said light modulating pattern is formed as a plurality of light reflecting parts arranged on the a reflectivity surface of said rotating disk, and wherein said photocoupler comprises a photoreflecter to detect the reflected light from said light reflecting parts.

34. The encoder according to claim 33, wherein said reflecting parts are formed at constant angular intervals.

35. The encoder according to claim 33, wherein said reflecting parts are formed at variable angular intervals.

36. The encoder according to claim 35, wherein said variable angular intervals of said reflecting parts gradually increase as the aperture area of said aperture diaphragm increases.

37. An exposure controlling device of a camera having an aperture diaphragm, said device comprising:
   a motorized driving mechanism to open and close said aperture diaphragm;
   an encoder which detects an actuation of said motorized driving mechanism, said encoder comprising:
      a photocoupler; and
      a rotating disk mounted in connection with said photocoupler, said rotating disk rotating in correspondence with the actuation of said motorized driving mechanism, wherein said rotating disk has a plurality of light modulating parts such that an output signal from said photocoupler varies in cycles in accordance with the rotation of said rotating disk;
   wherein said light modulating parts are formed at constant intervals, said light modulating parts are formed as a plurality of light reflecting parts arranged on a low reflectivity surface of said rotating disk, and said photocoupler comprises a photoreflecter to detect the reflected light from said light reflecting parts;
   wherein variation of the output signal and the aperture area of said aperture diaphragm are directly related; and
   a controlling unit which controls said motorized driving mechanism to drive said aperture diaphragm in accordance with signals received from said photocoupler.

38. The exposure controlling device according to claim 37, wherein said light modulating parts are formed as a plurality of transparent parts arranged on the opaque surface of said rotating disk, and wherein said photocoupler comprises a photointerrupter to detect the transmitted light through said transparent parts.

39. The exposure conrolling device according to claim 38, wherein said light transmitting parts are formed as angularly spaced radially-oriented slits.

40. The exposure controlling device according to claim 37, wherein said light modulating parts are formed at variable intervals.

41. The exposure controlling device according to claim 40, wherein said variable intervals increase as the aperture area of said aperture diaphragm increases.

42. The exposure controlling device according to claim 41, wherein said light modulating parts are formed as a plurality of transparent parts arranged on an opaque surface of said rotating disk, and wherein said photocoupler comprises a photointerrupter to detect the transmitted light through said transparent parts.

43. The exposure controlling device according to claim 42, wherein said light transmitting parts are formed as angularly spaced radially-oriented slits.

44. The exposure controlling device according to claim 41, wherein said light modulating parts are formed as a plurality of light reflecting parts arranged on a low reflectivity surface of said rotating disk, and wherein said photocoupler comprises a photoreflecter to detect the reflected light from said light reflecting parts.

45. An encoder for a camera that detects an aperture area of an aperture diaphragm, said encoder comprising:

a photocoupler; and a rotating disk mounted in connection with said photocoupler, said rotating disk rotating in correspondence with the actuation of said aperture diaphragm, wherein said rotating disk has a plurality of light modulating parts such that an output signal from said photocoupler varies in cycles in accordance with the rotation of said rotating disk;

wherein said light modulating parts are formed as a plurality of transparent parts arranged on the opaque surface of said rotating disk, and said photocoupler comprises a photointerrupter to detect the transmitted light through said transparent parts, wherein said transparent parts are formed at variable angular intervals, said variable angle intervals of said transparent parts gradually increase as the aperture area of said aperture diaphragm increases, and wherein each of said light modulating parts and the aperture area of said aperture diaphragm are directly related.

46. The encoder according to claim 45, wherein said light transmitting parts are formed as angularly spaced radially-oriented slits.

47. An encoder for a camera that detects an aperture area of an aperture diaphragm, said encoder comprising:

a photocoupler; and a rotating disk mounted in connection with said photocoupler, said rotating disk rotating in correspondence with the actuation of said aperture diaphragm, wherein said rotating disk has a plurality of light modulating parts such that an output signal from said photocoupler varies in cycles in accordance with the rotation of said rotating disk;

said light modulating parts are formed as a plurality of light reflecting parts arranged on a low reflectivity surface of said rotating disk, said light reflecting parts are formed at variable angular intervals, and said photocoupler comprises a photoreflecter to detect the reflected light from said light reflecting parts; and wherein each of said light modulating parts and the aperture area of said aperture diaphragm are directly related.

48. The encoder according to claim 47, wherein said variable angular intervals of said reflecting parts gradually increase as the aperture area of said aperture diaphragm increases.

* * * * *